United States Patent
Turnquist et al.

(10) Patent No.: US 11,953,970 B2
(45) Date of Patent: Apr. 9, 2024

(54) SYSTEM WITH MICROELECTRONIC CIRCUIT, AND A METHOD FOR CONTROLLING THE OPERATION OF A MICROELECTRONIC CIRCUIT

(71) Applicant: Minima Processor Oy, Oulu (FI)

(72) Inventors: Matthew Turnquist, Salo (FI); Navneet Gupta, Oulu (FI); Lauri Koskinen, Helsinki (FI); Tuomas Hollman, Oulu (FI)

(73) Assignee: Minima Processor Oy, Oulu (FI)

( * ) Notice: Subject to any disclaimer, the term of this patent is extended or adjusted under 35 U.S.C. 154(b) by 175 days.

(21) Appl. No.: 17/425,001

(22) PCT Filed: Jan. 23, 2019

(86) PCT No.: PCT/FI2019/050053
§ 371 (c)(1),
(2) Date: Jul. 22, 2021

(87) PCT Pub. No.: WO2020/152390
PCT Pub. Date: Jul. 30, 2020

(65) Prior Publication Data
US 2022/0121268 A1    Apr. 21, 2022

(51) Int. Cl.
*G06F 1/00*    (2006.01)
*G06F 1/3206*    (2019.01)
(Continued)

(52) U.S. Cl.
CPC .......... *G06F 1/3296* (2013.01); *G06F 1/3206* (2013.01); *G06F 11/3072* (2013.01); *H03K 19/0008* (2013.01)

(58) Field of Classification Search
CPC .............. G06F 1/3296; G06F 1/3206; G06F 11/3072; G06F 11/3013; G06F 11/3062; H03K 19/0008; Y02D 10/00
See application file for complete search history.

(56) References Cited

U.S. PATENT DOCUMENTS

| | | |
|---|---|---|
| 2011/0080202 A1 | 4/2011 | Moore et al. |
| 2011/0314306 A1 | 12/2011 | Lin et al. |

(Continued)

FOREIGN PATENT DOCUMENTS

| | | |
|---|---|---|
| WO | WO 2017/103338 A1 | 6/2017 |
| WO | WO 2018/193150 A1 | 10/2018 |
| WO | WO 2019/106226 A1 | 6/2019 |

OTHER PUBLICATIONS

Extended European Search Report dated Sep. 2, 2022 for corresponding application No. EP3915192 (10 pages).

(Continued)

*Primary Examiner* — Xuxing Chen
(74) *Attorney, Agent, or Firm* — Merchant & Gould P.C.

(57) ABSTRACT

A controllable voltage source (902) is coupled to a microelectronic circuit (901) for providing an operating voltage. Said microelectronic circuit (901) is adaptive, so its performance is at least partly configurable by value of said operating voltage. The operating voltage is regulated into conformity with a target value. Reregulating said operating voltage into conformity with a new target value involves a time constant. On a processing path a first register circuit (502) comprises a data input coupled to an output of a preceding first logic unit (501). The microelectronic circuit (901) responds to a digital value at said data input changing later than an allowable time limit by generating a timing event observation (TEO) signal. The allowable time limit is defined by at least one triggering edge of at least one triggering signal coupled to the first register circuit (502). The system uses said TEO signal to trigger an increase in said operating voltage faster than said time constant.

25 Claims, 9 Drawing Sheets

(51) Int. Cl.
 G06F 1/3296 (2019.01)
 G06F 11/30 (2006.01)
 H03K 19/00 (2006.01)

(56) References Cited

U.S. PATENT DOCUMENTS

2014/4176189    6/2014  Wang
2014/0340122 A1* 11/2014  Savanth ................ H02M 3/157
                                                            324/76.39
2019/0067984 A1*  2/2019  Heubi ................... H02M 3/157

OTHER PUBLICATIONS

Seongjong Kim et al, "Variation-Tolerant, Ultra-Low-Voltage Microprocessor With a Low-Overhead, Within-a- Cycle In-Situ Timing-Error Detection and Correction Technique", IEEE Journal of Solid-State Circuits, Jun. 2015, 50 (6):1478-1490, XP011582287 (13 pages).
International Search Report for International Patent Application No. PCT/FI2019/050053 dated Oct. 3, 2019, 6 pages.
Written Opinion of the International Searching Authority for International Patent Application No. PCT/FI2019/050053 dated Oct. 3, 2019, 10 pages.
Reyserhove, H. et al., "Margin Elimination Through Timing Error Detection in a Near-Threshold Enabled 32-bit Microcontroller in 40-nm CMOS", IEEE Journal of Solid-State Circuits, 53(7): 2101-2113 (Jul. 2018).

\* cited by examiner

SYSTEM WITH MICROELECTRONIC CIRCUIT, AND A METHOD FOR CONTROLLING THE OPERATION OF A MICROELECTRONIC CIRCUIT

This application is a National Stage Application of PCT/FI2019/050053, filed 23 Jan. 2019, and which application is incorporated herein by reference. To the extent appropriate, a claim of priority is made to the above disclosed application.

FIELD OF THE INVENTION

The invention is generally related to the field of adaptive microelectronic circuits, the operation of which can be changed by changing the value(s) of at least one operating parameter. In particular the invention is related to making rapid changes in an operating voltage of a microelectronic circuit in order to cancel effects of time borrowing.

BACKGROUND OF THE INVENTION

Adaptive microelectronic circuits are devices the operation of which can be changed by changing the value(s) of one or more operating parameters. Typical operating parameters of adaptive microelectronic circuits are operating voltage (or voltages, in case there are more than one) and clock frequency (or frequencies, in case there are more than one). The power consumption of a microelectronic circuit is roughly proportional to the square of the operating voltage, which means that lowering the operating voltage may enable achieving significant savings in power.

Lowering the operating voltage of a microelectronic circuit tends to increase propagation delays. In general, a microelectronic circuit comprises processing paths that comprise logic units and register circuits. A digital value produced by a logic unit gets temporarily stored in a register circuit at the triggering edge of a triggering signal, also commonly referred to as the clock signal of the register circuit. The output of the register circuit provides the temporarily stored digital value as an input to a subsequent logic unit on the processing path. If the digital value at the input of the register circuit changes late, i.e. after an allowable time limit defined by the triggering signal, it does not get properly stored but a data error is caused.

Some types of register circuits are capable of time borrowing. Time borrowing in a microelectronic circuit means that a circuit element is temporarily allowed to borrow time from a subsequent stage, i.e. change a digital value later than expected, if the subsequent circuit element(s) on the same processing path can handle it without corrupting the data that is being processed. A time-borrowing register circuit can store even a late-changed digital value appropriately. For many purposes it is advantageous if the time-borrowing register circuit is also configured to output a timing event observation (TEO) signal to inform a controlling entity that time borrowing has occurred. The controlling entity can then take appropriate action, like temporarily extending a clock cycle, in order to ensure that the effects of time borrowing will not propagate further along the processing path. It is also known to react to timing event observation signals by slowing down the clock frequency and/or commencing an increase in the operating voltage, so that the circuit elements of the microelectronic circuit would have more time to process the data and/or propagation delays would be reduced in general.

The known ways of reacting to timing event observation signals involve certain problems. Extending a clock cycle is not possible if there are synchronized I/O ports or other constraints that require the system to operate according to a strictly defined clock. Increasing the operating voltage will eventually shorten all delays and prevent further timing events—at the cost of increased energy consumption but those timing events that took place before that may have already caused erroneous values to be stored.

SUMMARY

It is an objective of the invention to enable cancelling the effects of time borrowing in a microelectronic circuit in a fast and reliable manner.

This and other advantageous objectives are achieved by using the detected occurrence of a timing event to trigger a fast increase in operating voltage, faster than what it would otherwise take to reregulate the operating voltage into conformity with a new target value. The fast increase in operating voltage is called "bumping" the operating voltage.

According to a first aspect there is provided a system comprising a microelectronic circuit and a controllable voltage source coupled to said microelectronic circuit for providing an operating voltage to said microelectronic circuit. Said microelectronic circuit is an adaptive microelectronic circuit, the performance of which is at least partly configurable by selecting a value of said operating voltage. Said system is configured to regulate said operating voltage into conformity with a target value, so that reregulating said operating voltage into conformity with a new, changed target value involves a time constant. Said microelectronic circuit comprises a first processing path, on which a first register circuit comprises a data input coupled to an output of a first logic unit that precedes said first register circuit on said first processing path. Said microelectronic circuit is configured to respond to a digital value at said data input changing later than an allowable time limit by generating a timing event observation signal, hereinafter TEO signal, wherein said allowable time limit is defined by at least one triggering edge of at least one triggering signal coupled to said first register circuit. Said system is configured to use said TEO signal to trigger an increase in said operating voltage faster than said time constant.

According to an embodiment said microelectronic circuit comprises a second processing path extending from a data output of said first register circuit through a second logic unit to a second register circuit. Said second logic unit has a characteristic propagation delay that depends on said operating voltage. Said first register circuit is a time-borrowing register circuit configured to effect time borrowing by validly storing a digital value at said data input that changed after said allowable time limit, and said increase in said operating voltage is dimensioned to cancel the effect of said time borrowing by shortening said characteristic propagation delay of said second logic unit. This involves the advantage that a single register circuit with time-borrowing capability may be sufficient to handle a timing event on a whole processing path without adverse consequences.

According to an embodiment said first register circuit is configured to apply a timing event detection window defining a length of time after said allowable time limit during which a changed digital value at said data input still becomes validly stored in said first register circuit, and the system is configured to shorten said characteristic propagation delay by at most the length of said timing event detection window through said increase in said operating voltage. This involves the advantage that the required amplitude of the increase in operating voltage can be made reasonably small.

According to an embodiment said first register circuit is configured to apply a timing event detection window defining a length of time after said allowable time limit during which a changed digital value at said data input still becomes validly stored in said first register circuit, and the system is configured to shorten said characteristic propagation delay by more than the length of said timing event detection window through said increase in said operating voltage. This involves the advantage that relatively powerful corrective action can be taken if needed, for example to provide additional safety margin and/or if there was a prediction that more timing events may occur in coming clock cycles.

According to an embodiment the system is configured to use said TEO signal to trigger said increase in said operating voltage by a constant amount of voltage per individual occurrence of said TEO signal. This involves the advantage that the component implementations can be made relatively simple and robust.

According to an embodiment the system is configured to make an amplitude of the triggered fast increase in operating voltage dependent on an operating region of the microelectronic circuit, wherein said operating region is defined in terms of operating parameter values. This involves the advantage that the principle of fast increasing the operating voltage can be applied flexibly to meet the various requirements of different kinds of situations.

According to an embodiment said first register circuit comprises a monitor circuit configured to monitor the timing of changes of digital values at said data input with respect to said allowable time limit, and generate said TEO signal in response to a digital value at said data input changing later than said allowable timing limit. This involves the advantage that only relatively little additional circuit area is needed to produce the TEO signals.

According to an embodiment said first register circuit is or belongs to a replica part used to replicate operation of an actual processing path with increased criticality to delay, and said microelectronic circuit is configured to generate said TEO signal as a response to finding an incorrect stored value in said first register circuit. This involves the advantage that the component implementations of the actual processing paths can be maintained very simple and straightforward.

According to an embodiment said system is configured to additionally respond to said TEO signal by initiating re-regulating of said operating voltage into conformity with a new, changed target value. This involves the advantage that a long-term effect of preventing further timing events can be combined with the short-term cancelling of the effect of time borrowing.

According to an embodiment said system is configured to respond to a command to change said target value by initiating re-regulating of said operating voltage into conformity with a new, changed target value. This involves the advantage that adaptive operation can be implemented also without the need to depend on the occurrence of timing events.

According to an embodiment the system is configured to generate said command to change said target value internally. This involves the advantage that the system can be made relatively independent of other systems or external components.

According to an embodiment said controllable voltage source comprises a switched-capacitor voltage regulator that comprises a first switch or group of switches clocked with a first switching signal and a second switch or group of switches clocked with a second switching signal. Switching values in said first switching signal are non-overlapping with respect to switching values in said second switching signal, and said system is configured to make an expedited change of value in said first and second switching signals as a part of said increase in said operating voltage. This involves the advantage of offering one relatively straightforward way of implementing the "bumping" in practice.

According to an embodiment said controllable voltage source comprises a clocked comparator configured to compare a measured value of said operating voltage to a reference value at a rate defined by a comparison clock, for triggering a charge pumping operation in said controllable voltage source when said measured value is lower than said reference value. Said system is configured to increase the frequency of said comparison clock as a part of said increase in said operating voltage. This involves the advantage of offering one relatively straightforward way of implementing the "bumping" in practice.

According to an embodiment said controllable voltage source comprises an input for receiving an input voltage and an output for outputting said operating voltage, and a controllable impedance between said input and said output, and said system is configured to decrease the value of said controllable impedance as a part of said increase in said operating voltage. This involves the advantage of offering one relatively straightforward way of implementing the "bumping" in practice.

According to an embodiment said controllable voltage source comprises a clocked comparator configured to compare a measured value of said operating voltage to a reference value, and said system is configured to make a temporary offset in said reference value as a part of said increase in said operating voltage. This involves the advantage of offering one relatively straightforward way of implementing the "bumping" in practice.

According to an embodiment the microelectronic circuit comprises a plurality of register circuits that each comprise a respective timing event observation output, for detecting timing events in multiple processing paths, and the system is configured to react to TEO signals differently depending on the processing path from which the TEO signals come. This involves the advantage that the processing of TEO signals and responding to them can be made in a flexible manner.

According to an embodiment the system is configured to monitor for occurrence of TEO signals during a time frame, and the system is configured to perform at least one of said increase in said operating voltage or re-regulating of said operating voltage into conformity with a new, changed target value in response to a number of TEO signals observed during said time frame. This involves the advantage of offering another way to handle the occurrence of timing events, adding versatility.

According to a second aspect there is provided a system comprising a microelectronic circuit and a controllable voltage source for providing an operating voltage to said microelectronic circuit. Said microelectronic circuit is an adaptive microelectronic circuit, the performance of which is at least partly configurable by selecting a value of said operating voltage. Said system is configured to regulate said operating voltage into conformity with a target value. Said microelectronic circuit comprises a first processing path, on which a first register circuit comprises a data input coupled to an output of a first logic unit that precedes said first register circuit on said first processing path. Said microelectronic circuit is configured to respond to a digital value at said data input changing later than an allowable time limit by generating a timing event observation signal, hereinafter TEO signal, wherein said allowable time limit is defined by at least one triggering edge of at least one triggering signal coupled to said first register circuit. Said microelectronic circuit comprises a second processing path extending from a data output of said first register circuit through a second logic unit to a second register circuit. Said second logic unit has a characteristic propagation delay that depends on said operating voltage. Said first register circuit is a time-borrowing register circuit configured to effect time borrowing by validly storing a digital value at said data input that changed after said allowable time limit. Said system is configured to use said TEO signal to trigger an increase in said operating voltage, said increase being dimensioned to cancel the effect of said time borrowing by shortening said characteristic propagation delay of said second logic unit.

According to a third aspect there is provided a method for providing an operating voltage to an adaptive microelectronic circuit, the performance of which is at least partly configurable by selecting a value of said operating voltage. The method comprises:

regulating said operating voltage into conformity with a target value using a controllable voltage source in which re-regulating said operating voltage into conformity with a new, changed target value involves a time constant, monitoring the timing of changes of digital values at a data input of a first register circuit coupled to an output of a first logic unit that precedes said first register circuit on a first processing path of said microelectronic circuit, responding to a digital value at said data input changing later than an allowable time limit by generating a timing event observation signal, hereinafter TEO signal, wherein said allowable time limit is defined by at least one triggering edge of at least one triggering signal coupled to said first register circuit, and using said TEO signal to trigger an increase in said operating voltage faster than said time constant.

According to an embodiment said increase in said operating voltage is dimensioned to cancel the effect of time borrowing in said first register circuit by shortening a characteristic propagation delay of a second logic unit, located on a second processing path extending from a data output of said first register circuit through said second logic unit to a second register circuit and having said characteristic propagation delay that depends on said operating voltage. This involves the advantage that a single register circuit with time-borrowing capability may be sufficient to handle a timing event on a whole processing path without adverse consequences.

According to an embodiment a timing event detection window is applied to define a length of time after said allowable time limit during which a changed digital value at said data input still becomes validly stored in said first register circuit; and said characteristic propagation delay is shortened by at most the length of said timing event detection window through said increase in said operating voltage. This involves the advantage that the required amplitude of the increase in operating voltage can be made reasonably small.

According to an embodiment a timing event detection window is applied to define a length of time after said allowable time limit during which a changed digital value at said data input still becomes validly stored in said first register circuit; and said characteristic propagation delay is shortened by more than the length of said timing event detection window through said increase in said operating voltage. This involves the advantage that the required amplitude of the increase in operating voltage can be made reasonably small. This involves the advantage that relatively powerful corrective action can be taken if needed, for example to provide additional safety margin and/or if there was a prediction that more timing events may occur in coming clock cycles.

According to an embodiment said triggered fast increase in said operating voltage is made by a constant amount of voltage per individual occurrence of said TEO signal. This involves the advantage that the component implementations can be made relatively simple and robust.

According to an embodiment an amplitude of the triggered fast increase in operating voltage depends on an operating region of the microelectronic circuit, wherein said operating region is defined in terms of operating parameter values. This involves the advantage that the principle of fast increasing the operating voltage can be applied flexibly to meet the various requirements of different kinds of situations.

According to an embodiment the method comprises additionally responding to said TEO signal by initiating re-regulating of said operating voltage into conformity with a new, changed target value. This involves the advantage that a long-term effect of preventing further timing events can be combined with the short-term cancelling of the effect of time borrowing.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

Figure 1:
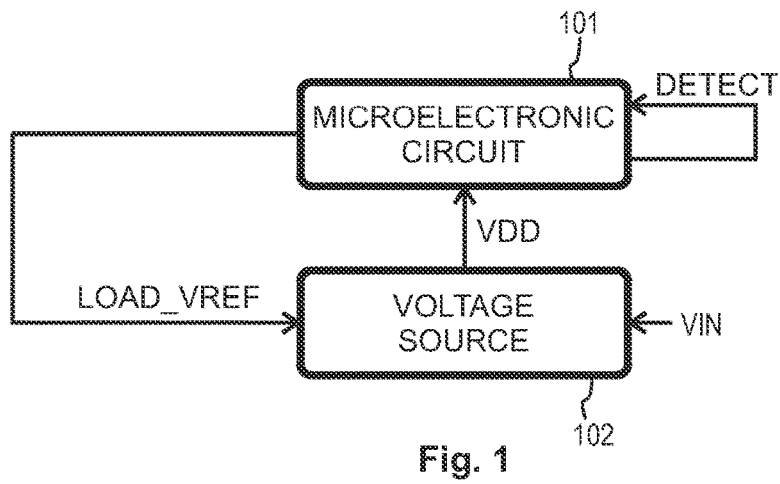
FIG. 1 illustrates a system with an adaptive microelectronic circuit and a controllable voltage source.

FIG. 1 illustrates schematically an adaptive microelectronic circuit 101 and a controllable voltage source 102 that is used to convert an input voltage VIN to an operating voltage VDD of the microelectronic circuit 101. The adaptive microelectronic circuit 101 is configured to detect events that indicate possibly disadvantageous effects of a low operating voltage, which is shown in FIG. 1 so that it can generate and analyze some kind of DETECT signals. The microelectronic circuit 101 is also configured to control the generation of the operating voltage VDD in the controllable voltage source 102 by issuing one or more control signals; a control signal LOAD_VREF is shown in FIG. 1 as an example. If the microelectronic circuit 101 comprises two or more cores, and/or a plurality of pipeline stages, power management can be divided so that the operating voltage level can be set separately per core and/or per pipeline stage.

Figure 2:
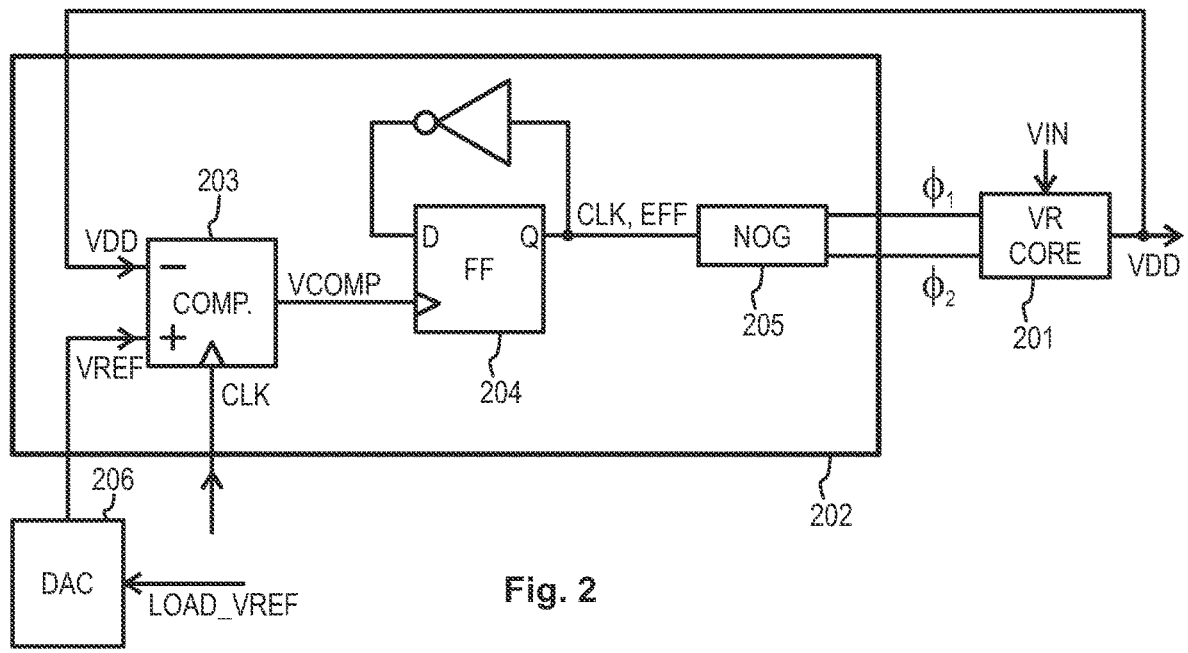
FIG. 2 illustrates an example of a controllable voltage source.

FIG. 2 illustrates parts of an exemplary controllable voltage source that can be used to generate and regulate an operating voltage VDD for a microelectronic circuit. The operating voltage VDD comes as an output from a voltage regulator core 201, which may be for example a high-efficiency switched-mode power supply, such as a switched-capacitor voltage regulator (SCVR), or a digital low-dropout (D-LDO) regulator. Inputs to the voltage regulator core 201 are the input voltage VIN as well as some control signals; here two non-overlapping switching signals $\phi 1$ and $\phi 2$ are shown as an example. The detailed structure of the voltage regulator core 201 is not important to this description. In the embodiment of FIG. 2 it is assumed to comprise one or more switches controlled by the non-overlapping switching signals $\phi 1$ and $\phi 2$.

The operating voltage VDD is monitored in a control loop 202 in which a clocked comparator 203 compares it to a reference voltage VREF for example at each rising edge of a clock signal CLK. Taken the polarity of its inputs, the clocked comparator 203 produces a high output signal if the comparison shows the operating voltage VDD to be lower than the reference voltage VREF. This type of control may be called lower-bound regulation. Upper-bound regulation would involve another comparator for comparing the operating voltage to an allowable maximum value. Any of upper- or lower-bound regulation can be used, as well as any combination thereof.

In FIG. 2 the output signal VCOMP of the clocked comparator 203 acts as the clocking signal of a toggling flip-flop 204, the output of which changes value at each rising edge of its clocking signal. The output signal CLK, EFF of the toggling flip-flop 204 goes into a non-overlapping generator 205, which uses it to produce the non-overlapping switching signals $\phi 1$ and $\phi 2$. The reference voltage VREF comes from a DAC (digital-to-analog converter) 206, which can be made to change the value of the reference voltage VREF with a control command LOAD_VREF.

Figure 3:
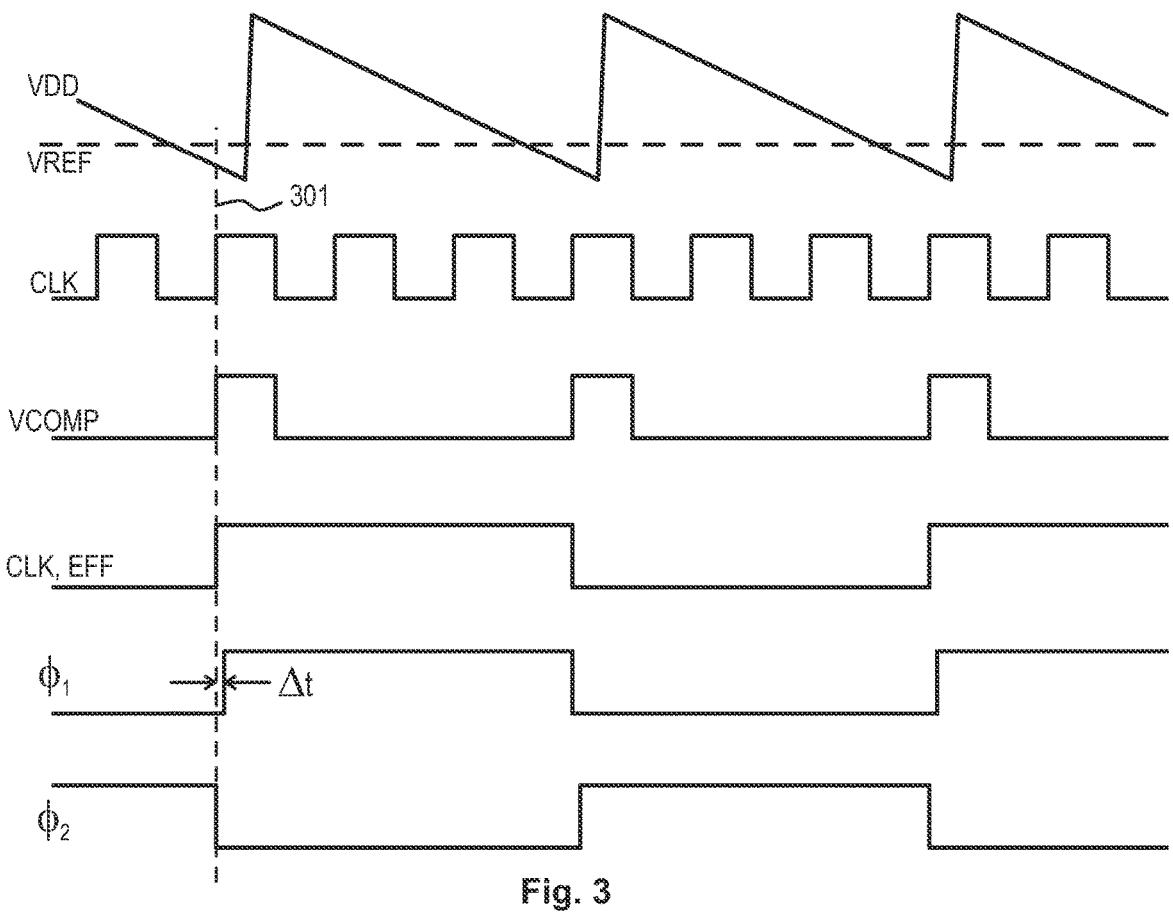
FIG. 3 illustrates an example of waveforms in the controllable voltage source of FIG. 2.

Examples of cyclical waveforms of the signals in FIG. 2 are shown in FIG. 3. Some dead time Δt may be used between complementary switching in the non-overlapping switching signals $\phi 1$ and $\phi 2$ to ensure that they are never high simultaneously. The topmost waveform shows how the value of the operating voltage VDD decreases until at some rising edge of the clock signal CLK it is found to be less than VREF; see point 301. This causes a rising edge in VCOMP, which makes CLK,EFF change value, which in turn makes the non-overlapping switching signals $\phi 1$ and $\phi 2$ both change value. The way in which the non-overlapping switching signals $\phi 1$ and $\phi 2$ control the switch(es) in the voltage regulator core 201 is such that every change in the values of $\phi 1$ and $\phi 2$ injects charge onto a capacitance that maintains VDD, and thus temporarily boosts the value of VDD so that it rises above VREF again, and the cycle begins anew. The amplitude of the sawtooth waveform of the operating voltage VDD may be small, in the order of a few percent of the value of the operating voltage VDD. The cycle time of the sawtooth waveform may depend on the load and on the converter design. Large variations are possible even if the system remains otherwise the same, like 5-10 nanoseconds at very large loads and even 200 nanoseconds at very small loads. For practical purposes it can be said that the value of VDD is regulated into conformity with the reference voltage value VREF. Strictly speaking the effective value of VDD is the average in time of its sawtooth waveform, so in the case of FIG. 3 the value of VDD is regulated into conformity with a target value that is slightly higher than VREF.

Figure 4:
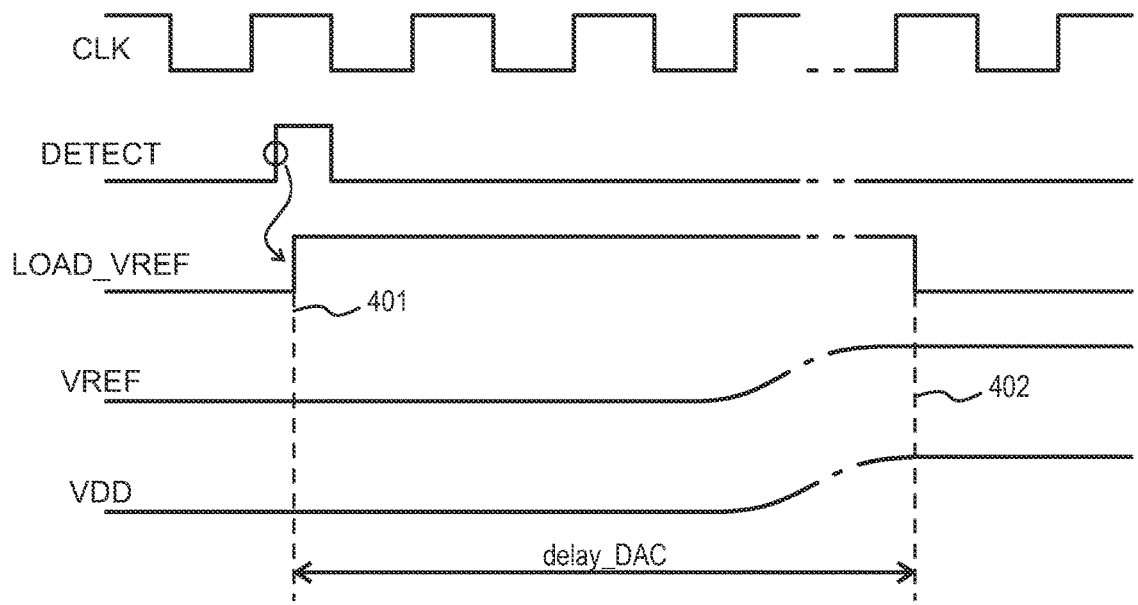
FIG. 4 illustrates an example of reregulating an operating voltage in response to a detected timing event.

FIG. 4 shows how a timing event observed in an adaptive microelectronic circuit may trigger reregulating the operating voltage VDD into conformity with a higher target value in a voltage source like that in FIG. 2. The clock signal CLK of FIG. 4 may be a different (slower) clock signal than that shown in FIG. 3, and the amplitude of the sawtooth waveform of VDD is so small that it cannot be discerned in FIG. 4. All waveforms in FIG. 4 are drawn with respect to a vertical scale of their own, so e.g. VREF and VDD are drawn separately: in practice they would be essentially the same voltage so if drawn with respect to the same vertical axis they would mask each other.

In this exemplary case a controlling entity in the microelectronic circuit 101 (see FIG. 1) interprets the occurrence of a DETECT signal as a sign of the operating voltage VDD being too low: propagation delays on at least some processing paths have become unacceptably long. In order to increase the operating voltage and thereby shorten the propagation delays the controlling entity reacts to the DETECT signal by setting the LOAD_VREF signal at point 401.

There may occur a relatively significant delay before the reference voltage VREF and the operating voltage VDD stabilize on the new, higher value at point 402. The total delay is shown as delay_DAC in FIG. 4. A contributing source of delay may be damping in the control loop 202 that may be needed to ensure stability; in FIG. 4 this is illustrated so that the increasing value of the operating voltage VDD lags slightly behind the corresponding change in VREF. At point 402 the operating voltage VREF has stabilized at the new value, and the control signal LOAD_VREF can be reset.

Figure 5:
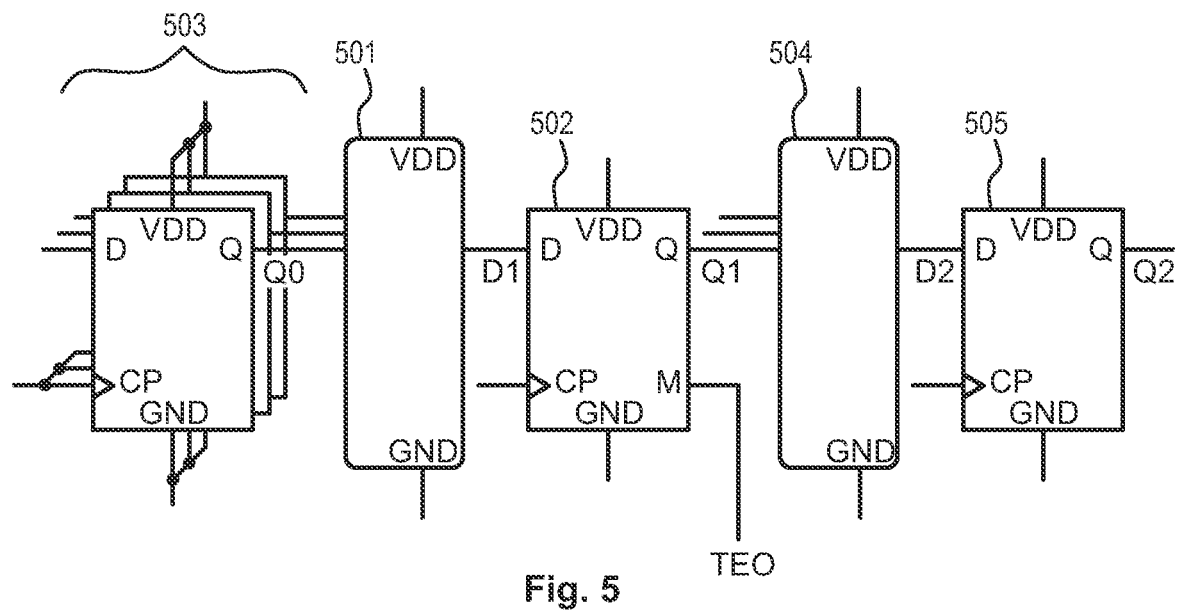
FIG. 5 illustrates an example of processing paths in a microelectronic circuit.

A potentially disadvantageous effect of the delay delay_DAC is considered with reference to FIGS. 5, 6, 7, and 8. FIG. 5 illustrates a part of a microelectronic circuit, which may be for example the microelectronic circuit 101 of FIG. 1. There is a so-called delay-critical processing path that comprises a logic unit 501 and a subsequent register circuit 502, which is configured to temporarily store a digital value coming from the logic unit 501. This processing path is delay-critical because the propagation delay that is expected to occur in the logic unit 501 is, according to a circuit analysis performed on the system design, among the longest in the whole microelectronic circuit. Inputs to the logic unit 501 come from other register circuits 503. Another processing path continues from the register circuit 502 to another logic unit 504 and a yet further register circuit 505. We may use the designations "first register circuit" 502 and "second register circuit" 505 for short.

The first register circuit 502 is configured to detect timing events, i.e. cases in which the digital value at the input of the first register circuit 502 changes later than an allowable time limit defined by one or more triggering edges in one or more triggering signals to the first register circuits. At the occurrence of a timing event the first register circuit 502 is configured to output a TEO (Timing Event Observation) signal; this is one example of a DETECT signal of a kind described above. All register circuits in FIG. 5 are assumed to be rising-edge-triggered flip-flops. From the viewpoint of the inventive solution this is just an example and not a limitation, since other kinds of register circuits could be considered as well.

Figure 6:
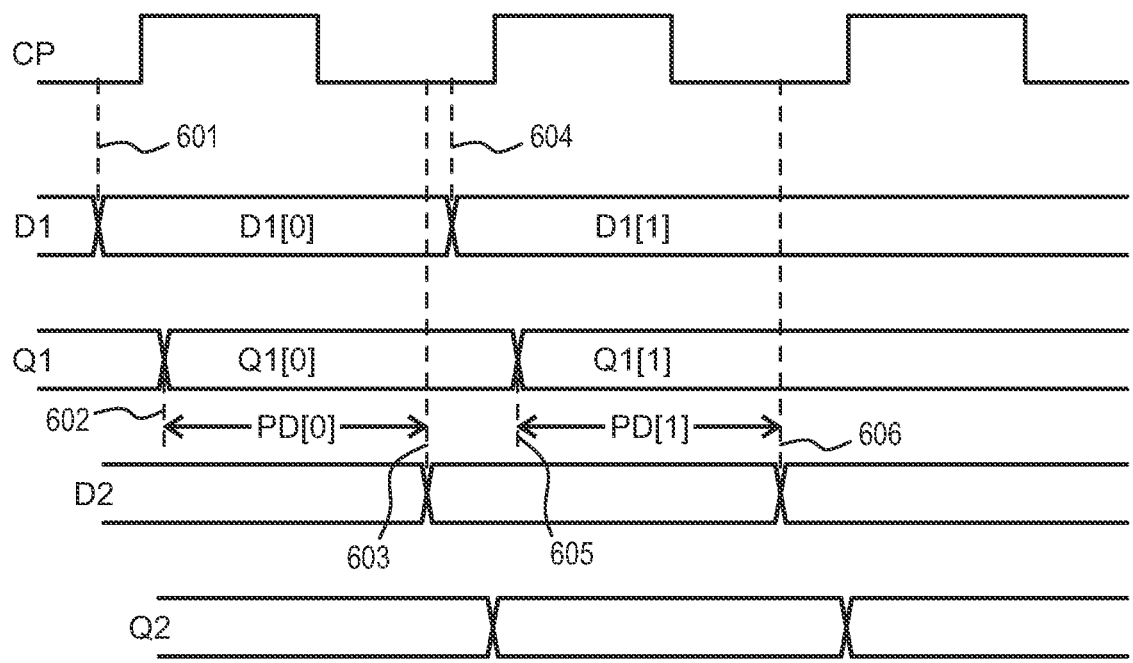
FIG. 6 illustrates waveforms in a first exemplary case.

FIG. 6 illustrates some signal waveforms during normal processing when timing events do not occur. The topmost waveform is the clock signal CP used as a triggering signal to the register circuits of FIG. 5. At point 601 a change occurs in the input value D1 to the first register circuit 502, well in time before the next triggering (rising) edge in the clock signal CP. After a certain propagation delay within the first register circuit the corresponding change appears in the output value Q1 of the first register circuit 502, and the temporarily stored digital value becomes available for the second logic unit 504. The processing in the second logic unit 504 takes a time called propagation delay PD[0], after which a change occurs in the input value D2 to the second register circuit 505 at point 603. A similar chain of events takes place between points 604, 605, and 606, with the propagation delay in the second logic unit 504 now marked as PD[1].

Figure 7:
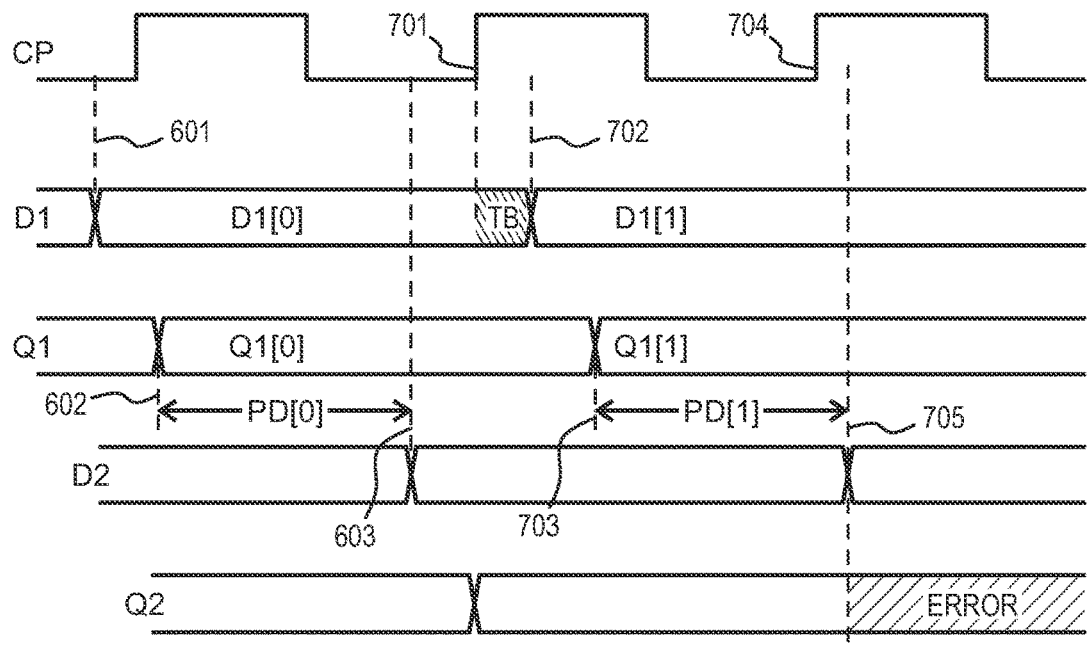
FIG. 7 illustrates waveforms in a second exemplary case.

In FIG. 7 the changes in the digital values D1, Q1, and D2 at points 601, 602, and 603 are similar to those in FIG. 6. However, the next change in the input value D1 to the first register circuit 502 comes at point 702, later than the triggering edge 701 that represents the allowable time limit in FIG. 7. The first register circuit 502 may still store this changed value correctly, if it is capable of time borrowing; the amount of borrowed time is illustrated with the marking "TB" in FIG. 7. Consequently the value that was stored at point 702 appears appropriately in the output Q1 of the first register circuit 502 at moment 703. However, if the propagation delay PD[1] in the second logic unit 504 is still as long as earlier, the subsequent change in the input value D2 to the second register circuit 505 may occur too late, i.e. at point 705 which is later than the triggering edge 704 in the clock signal CP before which it should have taken place. Here it is assumed that the second register circuit 505 is not capable of time borrowing, so the digital value temporarily stored therein is erroneous after point 705.

Figure 8:
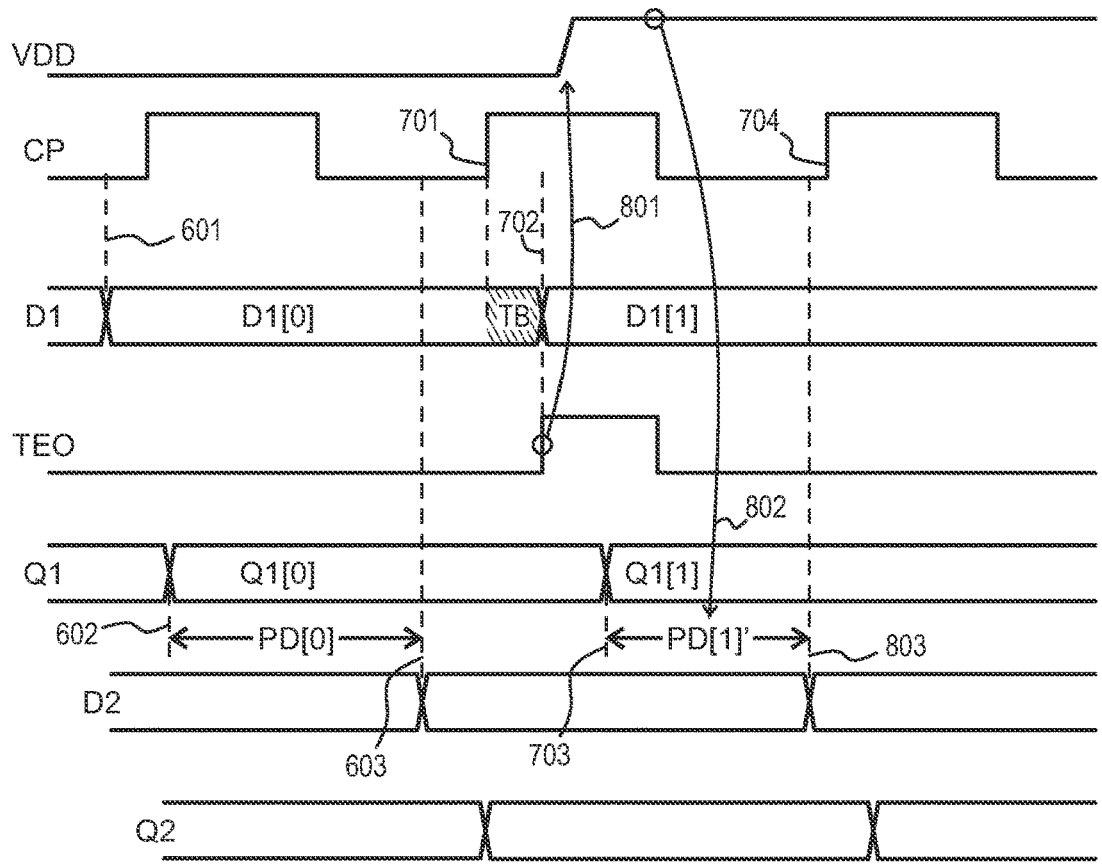
FIG. 8 illustrates waveforms in a third exemplary case.

FIG. 8 shows how the situation may be different if the system is configured to use a TEO signal to trigger a fast increase in the operating voltage VDD. In particular, such an increase may be dimensioned to cancel the effect of time borrowing by shortening the characteristic propagation delay in the second logic unit 504. In FIG. 8 the changes in the digital values D1, Q1, and D2 at points 601, 602, and 603 are again similar to those in FIG. 6. Similar to FIG. 7, the next change in the input value D1 to the first register circuit 502 comes at point 702, which is later than the triggering edge 701 that represents the allowable time limit. The amount of time borrowing that takes place in the first register circuit 502 is shown with the marking "TB".

When the late change in the input data D1 to the first register circuit 502 occurs at point 702, it causes the generation of a TEO signal. Strictly speaking this means that the TEO signal at the appropriate output of the first register circuit 502 assumes a high value at point 702. Arrow 801 shows how this in turn triggers a rapid increase in the operating voltage VDD. Arrow 802 shows how the new, increased value of the operating voltage VDD shortens the characteristic propagation delay in the second logic unit 504: the propagation delay marked as PD[1]' is significantly shorter than the propagation delay PD[1] in FIGS. 6 and 7. As a consequence, the change in the input value D2 to the second register circuit 505 changes at moment 803, which is before the triggering edge 704 in the clock pulse signal CP and thus in time for the processing result of the second logic unit 504 to become properly stored in the second register circuit 505.

The potentially disadvantageous effect of the delay called delay_DAC in FIG. 4 is related to the expression "rapid increase" above. Re-regulating the operating voltage VDD into conformity with a new, changed target value involves a time constant that may be too large: delay_DAC may be so long that the mechanism described with reference to FIGS. 1 to 4 is too slow to cancel the effect of time borrowing in the way shown in FIG. 8. In other words if only the mechanism of FIGS. 1 to 4 is available, even if the TEO signal took the role of a DETECT signal so that its rising edge at point 702 of FIG. 8 was used to set a LOAD_VREF signal as at point 401 in FIG. 4, the resulting increase in the operating voltage VDD (point 402 in FIG. 4) may come too late to shorten the propagation delay into PD[1]' soon enough.

Figure 9:
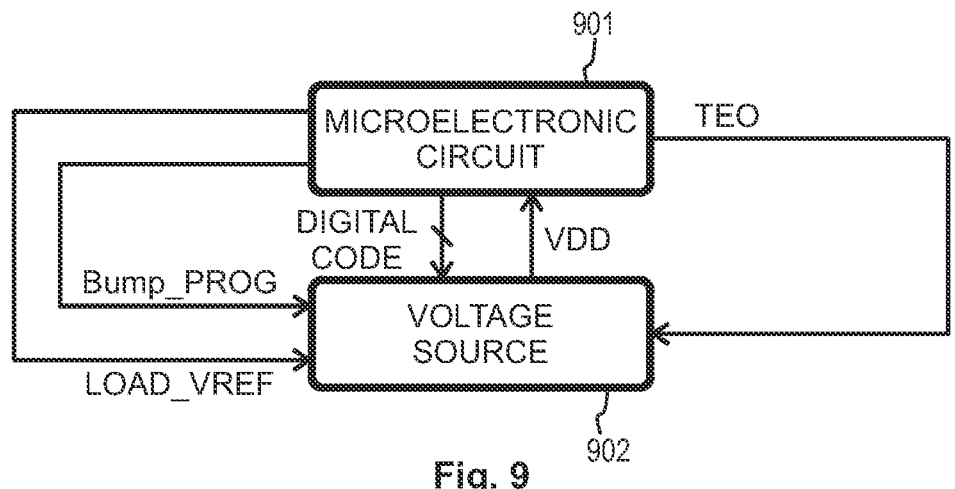
FIG. 9 illustrates a system with an adaptive microelectronic circuit and a controllable voltage source.
Figure 10:
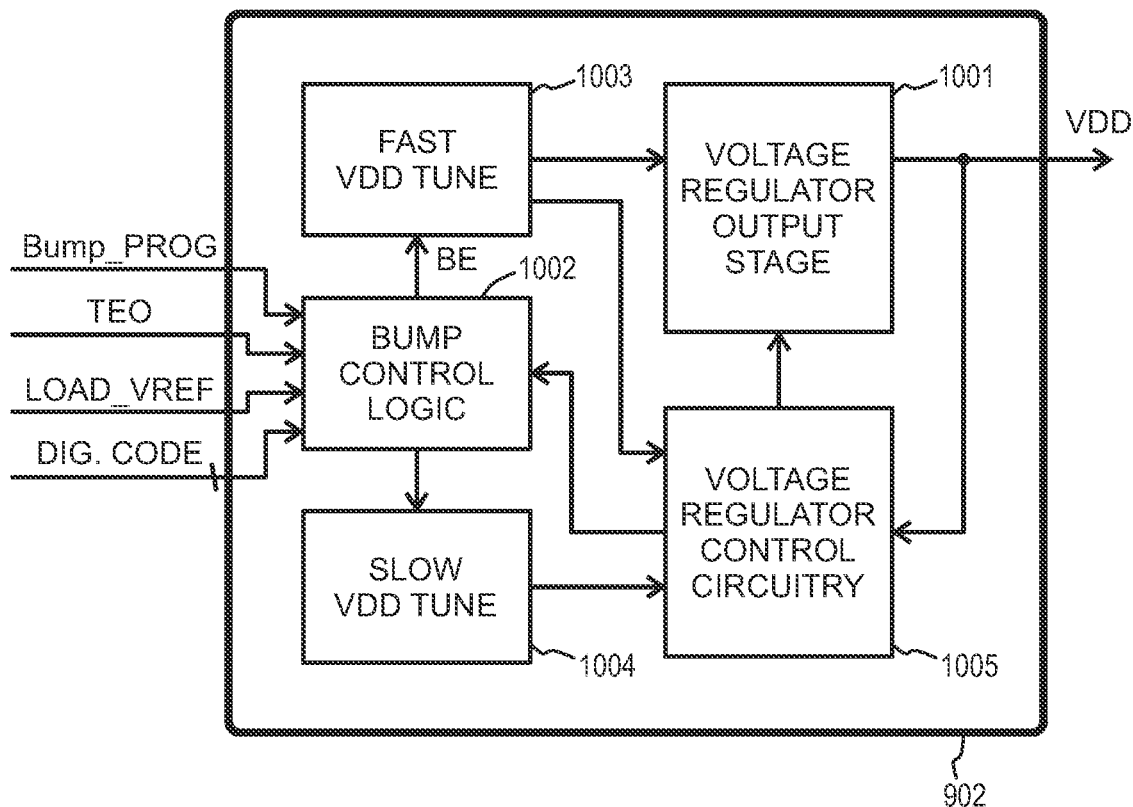
FIG. 10 illustrates an example of controlling a controllable voltage source.

FIGS. 9 and 10 illustrate a more advantageous approach. The system shown in FIG. 9 comprises a microelectronic circuit 901 and a controllable voltage source 902 that is coupled to the microelectronic circuit 901 for providing an operating voltage VDD thereto. The microelectronic circuit 901 is an adaptive microelectronic circuit, meaning that its performance is at least partly configurable by selecting a value of the operating voltage VDD. The lower the value of VDD, the smaller is the energy consumption of the microelectronic circuit 901. However, lowering the operating voltage VDD also increases propagation delays in the microelectronic circuit 901, so that an optimal balance should be aimed at under each operating conditions.

The system of FIG. 9 is configured to regulate the operating voltage VDD into conformity with a target value. This target value is not necessarily the same as a reference voltage value VREF, but directly or indirectly defined by it. For example if the controllable voltage source 902 comprises a switched-capacitor voltage regulator with lower-bound regulation, VREF can be used as said lower bound so that the target value becomes slightly higher than VREF just like in FIG. 3 above. The regulating of the operating voltage involves feedback and stabilizing in a control loop, which means that re-regulating the operating voltage VDD into conformity with a new, changed target value involves a time constant. The magnitude of the time constant comes from the selected physical arrangement of the control loop as well as from the resistance, capacitance, and inductance values and possibly other dimensioning aspects of the components involved.

The inner structure of the microelectronic circuit 901 is not shown in FIG. 9, but it can be assumed to comprise processing paths where register circuits are used to temporarily store digital values produced by logic units. For the purposes of the following description one of the processing paths may be called a first processing path, on which a first register circuit comprises a data input coupled to an output of a first logic unit that precedes said first register circuit on said first processing path. The microelectronic circuit 901 is configured to respond to a digital value at said data input changing late by generating a timing event observation signal. The definition of "late" is "later than an allowable time limit", wherein the allowable time limit is defined by at least one triggering edge of at least one triggering signal coupled to the first register circuit. The timing event observation signal may be called a TEO signal for short. It should be noted, however, that the designation "TEO signal" is used here only as a name, so it does not exclude the use of signals of other name for the same purpose.

The system is configured to use the TEO signal to trigger an increase in the operating voltage VDD faster than the time constant mentioned above. This means that there are at least two ways to affect the value of VDD: a "slow" way that involves the use of the regulating mechanism to make the operating voltage conform with a target value, and a "fast" way that can be used to increase the value of the operating voltage VDD faster. The advantage of the "slow" way is that it can be used for regulating in the long term: it utilizes strictly controlled and stabilized mechanisms to keep the operating voltage VDD accurately in conformity with what it is assumed to be. The advantage of the "fast" way is that although not as accurate as the "slow" way it will quickly "bump" the operating voltage VDD higher. The "fast" way is preferably feed-forward by nature, so that it just responds to a controlling signal in a predefined way without immediately responding to what the effect of the resulting change is.

In the exemplary system of FIG. 9 there are four control connections from the microelectronic circuit 901 to the controllable voltage source 902, called the TEO, LOAD_VREF, and Bump_PROG connections as well as a connection for digital code. An example of the controllable voltage source 902, together with an example of receiving the control information from the microelectronic circuit, is shown in FIG. 10.

In the example of FIG. 10 the controllable voltage source 902 comprises a voltage regulator output stage 1001 as well as control functionalities that here are divided into a bump control logic block 1002, a fast VDD tune block 1003, a slow VDD tune block 1004, and voltage regulator control circuitry 1005. The last-mentioned implements the feedback control mechanism used to (slowly) regulate the value of the operating voltage VDD. The bump control logic block 1002 receives the control information from the microelectronic circuit, as well as some monitoring information from the voltage regulator control circuitry 1005. It gives internal control commands to the fast VDD tune block 1003 and the slow VDD tune block 1004, of which the latter acts through making changes in how the voltage regulator control circuitry 1005 operates. The fast VDD tune block 1003 is, as its name indicates, responsible for causing the "bumps" or fast increases in the operating voltage VDD. It may act both through the voltage regulator control circuitry 1005 and directly upon the voltage regulator output stage, as will be explained in more detail later.

The microelectronic circuit 901 may use the Bump_PROG control connection to initiate loading into the bump control logic block 1002 new machine-readable instructions about how the last-mentioned should work. The actual loading of digital data that contains such instructions may take place through the connection for digital code. The microelectronic circuit 901 may use the LOAD_VREF control connection to initiate loading a new value of the reference voltage value VREF into the bump control logic block 1002, which in turn may forward it to the voltage regulator control circuitry 1005. Alternatively if the memory of new reference voltage values is a property of the voltage regulator control circuitry 1005, a control command coming through the LOAD_VREF control connection may make the bump control logic block 1002 command the voltage regulator control circuitry 1005 to load a new VREF value into use from its memory.

In the system of FIGS. 9 and 10 the microelectronic circuit 901 is configured to deliver TEO signals directly to the controllable voltage source 902 through the TEO connection. Taken that one of the uses of TEO signals is to selectively trigger extremely fast increases in operating voltage, it is advantageous to make each TEO signal available to the bump control logic block 1002 with as little delay as possible. By executing its operating program the bump control logic block 1002 decides, if and when a received TEO signal indicates the need for "bumping", i.e. for increasing the value of the operating voltage VDD faster than what the time constant of the regulating mechanism defines. In the following it is assumed that a decision by the bump control logic block 1002 to "bump" the operating voltage VDD makes it issue a BE (Bump Event) control signal to the fast VDD tune block 1003.

Figure 11:
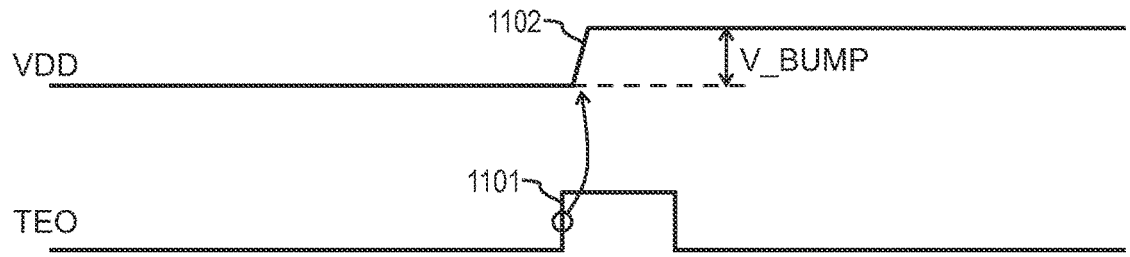
FIG. 11 illustrates fast reacting to a timing event observation signal.
Figure 12:
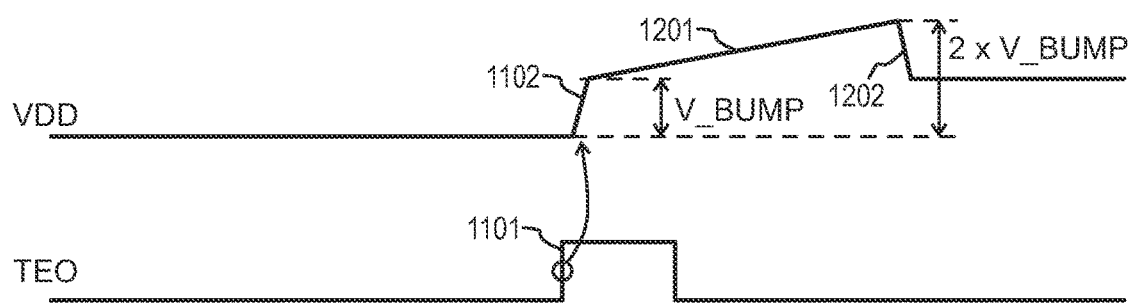
FIG. 12 illustrates fast reacting to a timing event observation signal and subsequent reregulating.
Figure 13:
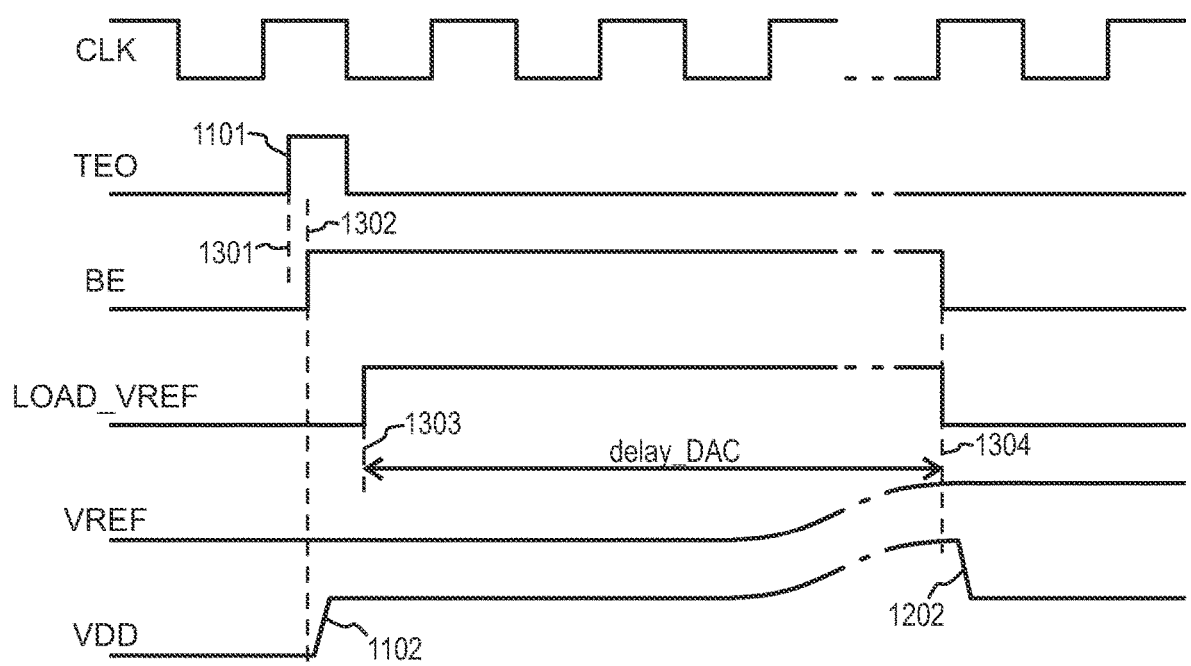
FIG. 13 illustrates an example of applying the principle of FIG. 12.

FIGS. 11, 12, and 13 illustrate some exemplary approaches to the task of increasing the operating voltage VDD in response to a detected timing event. FIG. 11 illustrates a simple case in which a rising edge 1101 in a TEO signal triggers an increase 1102 in the operating voltage VDD faster than would be possible solely through the operation of the feedback-based regulating mechanism. This can be done so that the bump control logic block 1002 reacts to the occurrence of a TEO signal by issuing a BE control signal to the fast VDD tune block 1003, which then acts directly upon the voltage regulator output stage 1001 to cause an increase in VDD by the amount V_BUMP.

FIG. 12 illustrates a case in which the system is configured to additionally respond to the TEO signal by initiating re-regulating of the operating voltage into conformity with a new, changed target value. The bump control logic 1002 first reacts to the rising edge 1101 in the TEO signal by issuing a BE control signal to the fast VDD tune block 1003, which then acts directly upon the voltage regulator output stage 1001 to cause a fast increase 1102 in VDD by the amount V_BUMP. The initiated re-regulating of the operating voltage into conformity with the new, changed target value is visible as the slow increase 1201 immediately after the fast increase 1102 in VDD. The slow increase continues until the operating voltage VDD is higher than its original level by two times V_BUMP. At that point the BE control signal to the fast tune block 1003 is cancelled, causing a decrease 1202 in VDD by the amount V_BUMP. As an overall result, the operating voltage remains one V_BUMP higher than its original level.

One way of implementing the principle shown schematically in FIG. 12 is elaborated upon in more detail in FIG. 13. The rising edge 1101 in the TEO signal occurs at point 1301. The bump control logic 1002 responds by setting the BE signal at point 1302, causing a fast increase 1102 in the operating voltage VDD. Somewhat later at point 1303 the LOAD_VREF control signal is set. It is not necessary that this happens later than e.g. the setting of the BE signal at point 1302, but it could happen simultaneously or even before that.

Similar to FIG. 4, setting the LOAD_VREF control signal initiates a process in which a DAC is given a new digital input value, on the basis of which the DAC generates a new value for the analog reference voltage VREF. It takes for the duration of delay_DAC before the analog reference voltage VREF stabilizes on said new value. The gradual increase in VREF during delay_DAC causes a similar gradual increase in the operating voltage VDD (possibly with some lag, which is not separately shown in FIG. 13). At point 1304 the voltages are determined to have stabilized, which causes the BE and LOAD_VREF signals to be reset. Resetting the BE signal cancels the bumping effect, which is seen as the decrease 1202 in the operating voltage VDD. Due to the gradual increase during delay_DAC the level of VDD is, despite the decrease 1202, higher after point 1304 than it was before the occurrence of the TEO signal at point 1301.

The effect of "bumping" the operating voltage VDD can be considered with reference to FIGS. 5, 8, and 9. FIG. 5 is now considered to illustrate a part of the microelectronic circuit 901. It comprises a first processing path on which the first register circuit 502 comprises a data input coupled to an output of the first logic unit 501 that precedes the first register circuit 502 on the first processing path. The microelectronic circuit comprises a second processing path that extends from a data output of the first register circuit 502 through a second logic unit 504 to a second register circuit 505. The second logic unit 504 has a characteristic propagation delay that depends on the operating voltage VDD; see propagation delays PD[0] and PD[1]' in FIG. 8. The first register circuit 502 is a time-borrowing register circuit configured to effect time borrowing (see TB in FIG. 8) by validly storing a digital value at its data input that changed after the allowable time limit defined by the triggering signal CP (see rising edge 701 in FIG. 8). The fast increase 1102 in the operating voltage VDD is dimensioned to cancel the effect of time borrowing by shortening the characteristic propagation delay of the second logic unit 504 from PD[0] to PD[1]'.

Concerning said dimensioning the length of a so-called timing event detection window may come into play. The timing event detection window is the length of time after the allowable time limit during which the late change of a digital value must arrive at a data input of a time-borrowing register circuit in order to become validly stored. As an example, a time-borrowing flip-flop may comprise two consecutive latches clocked at opposite phases of a clock signal. If the clock signal is provided to the first latch delayed with respect to that provided to the second latch, the amount of delay defines the timing event detection window.

It may not be worthwhile to aim at shortening a characteristic propagation delay in a subsequent logic unit by more than the length of the timing event detection window. If the change in the digital data came even later than the end of the window, it didn't become properly stored even in the first register circuit, so shortening the characteristic propagation delay in the second logic unit cannot cancel the effect of time borrowing. In other words, in an advantageous embodiment the system is configured to shorten the characteristic propagation delay by at most the length of the timing event detection window through the fast increase in the operating voltage VDD.

In practice the length of the timing event detection window may involve margins, so that at least a majority of actual timing events may be assumed to come well before the end of the timing event detection window and consequently not need such a generous shortening of the propagation delay. Therefore it may be justifiable to configure the system so that a single increase in the operating voltage shortens the characteristic propagation delay in the second logic unit by less than the length of the timing event detection window. In an embodiment the system may be configured to use a TEO signal to trigger an increase in the operating voltage VDD by a constant amount of voltage, like 10 millivolts for example, per individual occurrence of the TEO signal.

However, in other embodiments and/or in other cases it may be advantageous to deliberately make a larger increase in the operating voltage VDD, by an amount that will shorten the characteristic propagation delay in the second logic unit by more than the length of the timing event detection window. Such a larger increase may be advantageous to provide additional safety margin, and/or in cases where there is reason to believe that more timing events may occur in the coming clock cycles. The last-mentioned may be the case for example when previous experience shows that timing events tend to occur not isolated but in sequences, and/or if a characteristic of the operating environment has changed very suddenly, and/or if the microelectronic circuit is about the make or has just made a change in what kind of processing it performs on which kind of data.

In the examples discussed so far a time-borrowing register circuit 502 with a monitor functionality has been described as the means for detecting timing events. In such embodiments the first register circuit 502 belongs to an actual processing path within the microelectronic circuit, and either comprises or is associated with a monitor circuit. The monitor circuit is configured to monitor the timing of changes of digital values at the data input of the register circuit with respect to the allowable time limit. The monitor circuit is also configured to generate the TEO signal in response to a digital value at the data input changing later than the allowable data limit. Examples of physical implementations of monitor circuits are found for example in the patent application number PCT/FI2017/050290.

Other possibilities exist to detect timing events and to produce TEO signals. One of them involves the use of so-called replica parts that replicate operation of actual processing paths with increased criticality to delay. The increased criticality means that components in the replica part are made intentionally slower than those on the corresponding actual processing path, so that a timing event is more likely to occur in a replica part than on the actual processing path the operation of which it replicates. Timing events in a replica part can be noticed as anomalous output values because as a difference to the actual processing paths the replica parts receive fixed input values. According to an embodiment the first register circuit mentioned above may be (or belong to) a replica part, so that the microelectronic circuit is configured to generate the TEO signal as a response to finding an incorrect stored value in the first register circuit.

FIGS. 12 and 13 illustrate embodiments in which the system is configured to respond to the TEO signal by not only triggering the "bump" or fast increase in the operating voltage VDD, but additionally by initiating (slow) re-regulating of the operating voltage VDD into conformity with a new, changed target value. This should not be taken to mean that every case of re-regulating the operating voltage VDD into conformity with a new, changed target value should necessarily follow a preceding fast increase. There may be situations in which the system finds it advantageous to (slowly) increase the value of the operating voltage VDD for some other reason than for cancelling the effect of time borrowing that had just occurred. The system may be configured to generally respond to a command to change the target value of VREF by initiating re-regulating of the operating voltage into conformity with a new, changed target value. Such a command may come from outside the system. As an alternative the system may be configured to internally generate said command when speed is not needed as it is generally more energy efficient to operate the system at slower speeds. For example, the system's software may require a low priority interrupt, which does not require high speed.

Another generalization to the principles discussed above is the triggering of a "bump" in the operating voltage VDD in response to some other triggering event than the detection of a timing event. An example of such other kind of a triggering event is the so-called on-chip IR drop. The product of electric current (I) and resistance (R) represents the voltage drop over a load that has that electric current flowing through it and that exhibits that resistance. A small measurement resistance on a current path that delivers electric current to an actual load can be used to monitor the electric current drawn by the actual load. An IR drop, i.e. a sudden increase in the voltage drop across the measurement resistance, means that the actual load has suddenly begun to draw more current. If the actual load is a microelectronic circuit comprising processing paths, this may in turn mean that it has suddenly become more susceptible to timing events. Therefore it may be justified to use the detected IR drop to trigger an increase in the operating voltage of the microelectronic circuit faster than a time constant that otherwise characterizes reregulating its operating voltage into conformity with a new target value.

Figure 14:
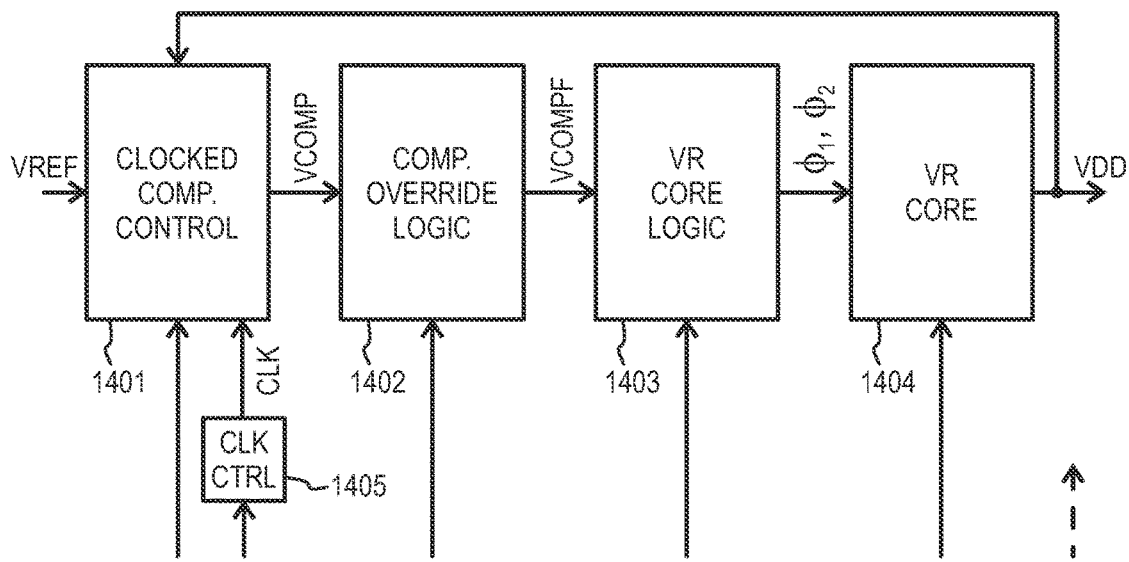
FIG. 14 illustrates an example of a controllable voltage source.

Next some practical ways of implementing the "bumping" are considered. FIG. 14 illustrates an example of what may constitute the voltage regulator output stage 1001 and the voltage regulator control circuitry 1005 in FIG. 10. It comprises a clocked comparator control block 1401, a comparison override logic 1402, a voltage regulator core logic 1403, and the actual voltage regulator core 1404. Inputs to the clocked comparator control block 1401 comprise the analog reference voltage VREF, a sample of the actual operating voltage VDD, and a comparison clock signal CLK that comes from CLK control block 1405. The clocked comparator control block 1401 outputs a signal VCOMP, which is an input to the comparison override logic 1402. The comparison override logic 1402 outputs a signal VCOMPF, which is an input to the voltage regulator core logic 1403. The voltage regulator core logic 1403 outputs a first switching signal φ1 and a second switching signal φ2, which are inputs to the voltage regulator core 1404. The arrows below in FIG. 14 show that one or more control signals can be used to control the operation of the blocks 1401 to 1405 in order to "bump" the operating voltage VDD.

The voltage regulator core 1404 may comprise a switched-capacitor voltage regulator that comprises a first switch (or first group of switches) and a second switch (or second group of switches). The first switch (or group) is clocked with the first switching signal φ1 and the second switch (or group) is clocked with the second switching signal φ2. This requires that the switching values (high values) in the switching signals φ1 on one hand and φ2 on the other hand are non-overlapping with respect to each other. In order to "bump" the operating voltage, i.e. as a part of (fast) increasing the operating voltage VDD, the system may be configured to make an expedited change of value in the first and second switching signals φ1 and φ2.

Figure 15:
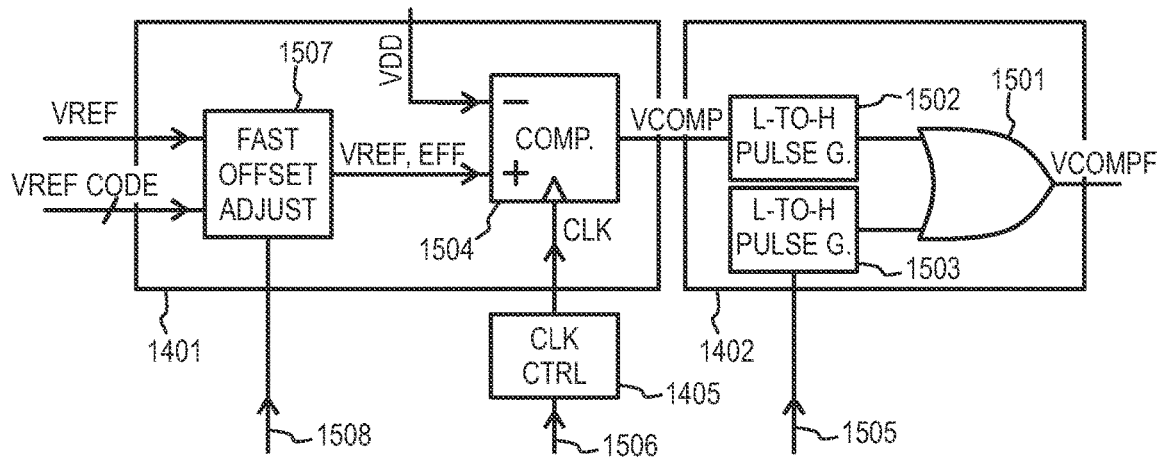
FIG. 15 illustrates an example of some functional blocks of the controllable voltage source of FIG. 14.
Figure 16:
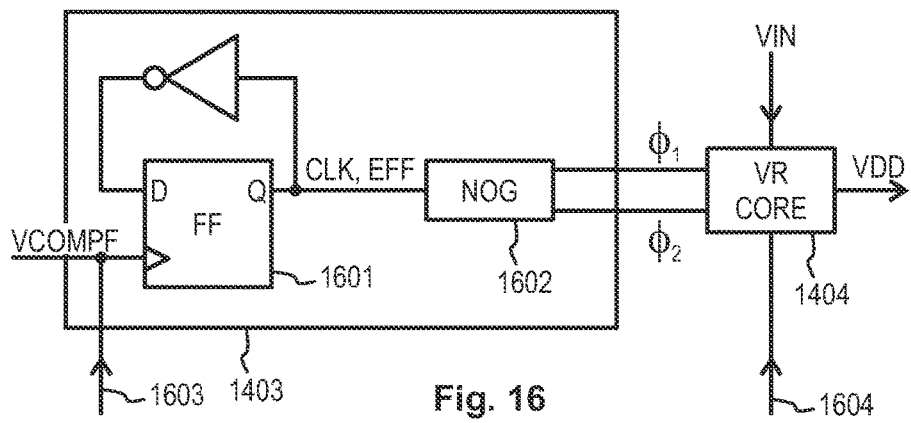
FIG. 16 illustrates an example of some functional blocks of the controllable voltage source of FIG. 14.

FIGS. 15 and 16 show examples of circuitry that can be used for making an expedited change of value in the signals φ1 and φ2. In FIG. 15 the comparison override logic 1402 comprises an OR gate 1501, the inputs of which come from the respective low-to-high pulse generators 1502 and 1503. The output of the OR gate 1501 is the signal VCOMPF. Inputs to the low-to-high pulse generators 1502 and 1503 are the signal VCOMP to the upper and an additional control signal to the lower of them.

Again assuming lower-bound regulation, the clocked comparator 1504 in the clocked comparator control block 1401 produces a high value of VCOMP at every such rising edge of the comparison clock signal CLK at which the value of the operating voltage VDD was found smaller than the value of the reference voltage VREF. A corresponding high value goes through the upper low-to-high pulse generator 1502 and the OR gate 1501 to the signal VCOMPF, making the flip-flop 1601 in the voltage regulator core logic 1403 change its output value, which in turn makes the non-overlapping generator 1602 change the values of the switching signals φ1 and φ2.

If a high value comes as a control input to the lower low-to-high pulse generator 1503, it forces the output of the OR gate 1501 (and thus the signal VCOMPF) high irrespective of what is the current value of VCOMP. Following the same chain of events as above, this may cause an expedited change of value in the switching signals φ1 and φ2. Arrow 1505 illustrates the control input that can be used for this purpose.

A similar effect can be accomplished by coupling a control signal to the clocking input of the flip-flop 1601. A high value of this control signal will make the flip-flop 1601 in the voltage regulator core logic 1403 change its output value, which in turn makes the non-overlapping generator 1602 change the values of the switching signals φ1 and φ2. Arrow 1603 illustrates the control input that can be used for this purpose.

The control signal 1506 to the CLK control block 1405 offers another way of making an expedited change of value in the switching signals φ1 and φ2. It may be noted that the clocked comparator 1504 is configured to compare a measured value of the operating voltage VDD to the reference value VREF at a rate defined by the comparison clock signal CLK. This has the purpose of triggering a charge pumping operation in the controllable voltage source when said measured value is lower than the reference value. The system may be configured to increase the frequency of the comparison clock signal CLK as a part of the (fast) increase in the operating voltage VDD. An increase in the frequency means that the next time of detecting that the value of VDD is smaller than VREF comes earlier, thus causing an expedited change of value in the switching signals φ1 and φ2.

Yet another possibility involves affecting directly the operation of the voltage regulator core 1404. The voltage regulator core 1404, or in general the controllable voltage source, may comprise an input for receiving an input voltage VIN, whereas it also comprises an output for outputting the operating voltage VDD. The voltage regulator core 1404 may comprise a controllable impedance between said input and said output. The system may be configured to decrease the value of said controllable impedance as a part of the (fast) increasing of the operating voltage VDD. This possibility is particularly suitable if the voltage regulator core

1404 is or comprises a digital low-dropout regulator (D-LDO). Arrow 1604 illustrates the control input that can be used for this purpose.

Yet another possibility involves making a temporary offset to the reference value VREF. As noted above, the controllable voltage source may comprise a clocked comparator 1504 configured to compare a measured value of the operating voltage VDD to the reference value VREF. In FIG. 15 the clocked comparator control block 1401 comprises a fast offset adjust functionality 1507, with which the system is configured to make a temporary offset in the reference value VREF as a part of the (fast) increasing of the operating voltage VDD. Due to the presence of the fast offset adjust functionality 1507 the clocked comparator 1504 receives an effective reference value VREF,EFF at one of its inputs, which may not be the same as the original reference value VREF. Arrow 1508 illustrates the control input that can be used for this purpose.

The control signals to the control inputs 1505, 1506, 1508, 1603, and 1604 may come from a bump control logic functionality (see block 1002 in FIG. 10 as an example). For the purpose of this invention it is immaterial whether digital or analog technologies are used to implement such a functionality, and what is the division of responsibilities between hardware and software in such a functionality. It is not necessary to have the functionality of the kind of the bump control logic centralized in one location: various distributed implementations are possible.

Also in the embodiments of FIGS. 9, 10, and 14-16 the power management may be divided between cores and/or pipeline stages, if there is a plurality of either. It is possible to monitor for occurrence of timing events in each core and/or pipeline stage separately, and to use "bumping" to cancel the effects of time borrowing in each of them independently of others. It is also possible that at least some level of coordination is applied, for example so that even if timing events are monitored for separately in two or more pipeline stages, a "bump" is forwarded from one stage to at least the subsequent stages (and possibly to other parts of the microelectronic circuit as well) so that eventually a timing event detected in one power management domain has effects also in at least some of the other domains.

It should be noted that representing VDD with a straight, essentially horizontal or steadily increasing line is a simplification. The operating voltage VDD may be considered as the superposition of an average VDD and the voltage regulator's inherent ripple, of which the latter is often referred to as the AC ripple. Changes in the operating voltage VDD, described in this text as either fast increases or slow re-regulating, refer to changes in the DC component.

Figure 17:
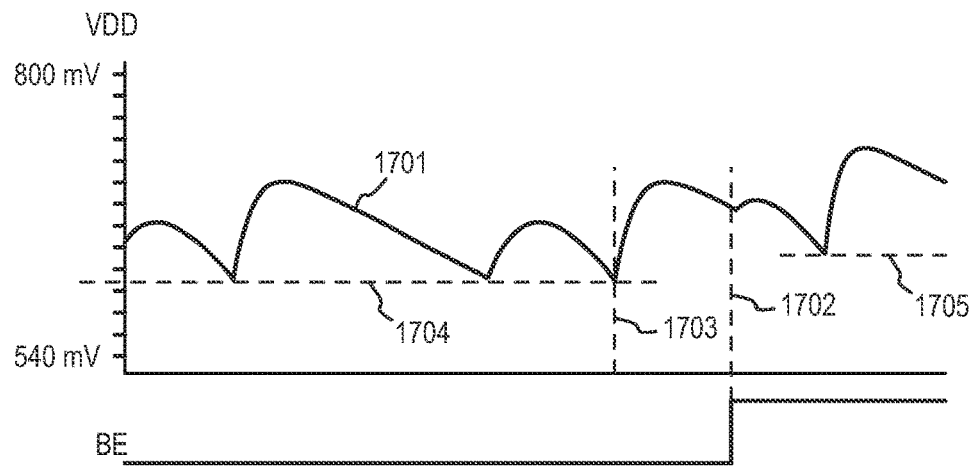
FIG. 17 illustrates an example of rapidly increasing an operating voltage.
Figure 18:
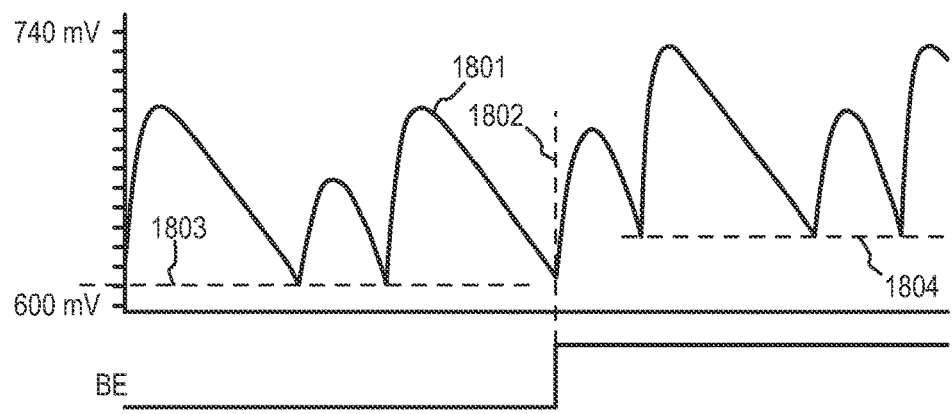
FIG. 18 illustrates another example of rapidly increasing an operating voltage.

FIGS. 17 and 18 provide some more detailed explanations. In FIGS. 17 and 18 the graphs 1701 and 1801 both represent simulated actual operating voltages in a microelectronic circuit and an effect of "bumping". Below the graph in each case is a schematic representation of the BE (bump event) signal, with which a bump control logic functionality triggers a fast increase in the operating voltage VDD. In both simulations the form of the VDD graph exhibits what is essentially a real-world exemplary form of the idealized sawtooth waveform of VDD in FIG. 3. It is assumed here that the voltage regulator core is essentially a SCVR.

In FIG. 17 the BE signal goes high at point 1702, which comes relatively quickly after the last time when the switching signals of the SCVR changed value at point 1703. In other words in FIG. 17 the BE signal goes high when the momentary level of VDD is still quite high above the valley-bottom level 1704 that prevailed before point 1702. The "bumping" at point 1702 interrupts the ongoing steady decline that would otherwise have continued until the level of VDD had again reached the previous valley-bottom level 1704. It also raises the valley-bottom level to a new, higher level 1705.

The last-mentioned effect is more clearly visible in FIG. 18, in which the BE signal goes high at point 1802. This point happens to come almost at the moment when the switching signals of the SCVR would have changed value even without bumping: the momentary level of VDD had almost reached the prevailing valley-bottom level 1803. Therefore no similar effect as the discontinuation of an ongoing steady decline in FIG. 17 is easily discerned in FIG. 18. However, FIG. 18 clearly shows how the valley-bottom level rises significantly higher, to level 1804, after moment 1802. This is the manifestation of a fast increase in (average) operating voltage that is the essence of "bumping".

For reasons of simplicity the detection of timing events and the resulting fast increasing of VDD was explained above with reference to only one register circuit on one processing path of a microelectronic circuit. A practical microelectronic circuit is likely to comprise a large plurality of processing paths, a number of which may comprise monitor-equipped register circuits and/or replica parts for the purpose of detecting timing events and producing TEO signals. The microelectronic circuit may comprise an OR-tree and/or other signal collecting structures for ensuring that a TEO signal will get noticed and properly processed irrespective of from which part of the microelectronic circuit it comes.

In some cases, however, it may be advantageous if the system that comprises the microelectronic circuit and the controllable voltage source can react to TEO signals differently depending on the processing path(s) from which the TEO signal(s) come. For this purpose the microelectronic circuit may comprise a plurality of register circuits that each comprise a respective timing event observation output, for detecting timing events in multiple processing paths. The signal collecting structure may comprise separate OR-trees, or other kinds of selective arrangements, for enabling the system to maintain awareness of from which processing path (or at least from which type of processing path) a TEO signal came.

Figure 19:
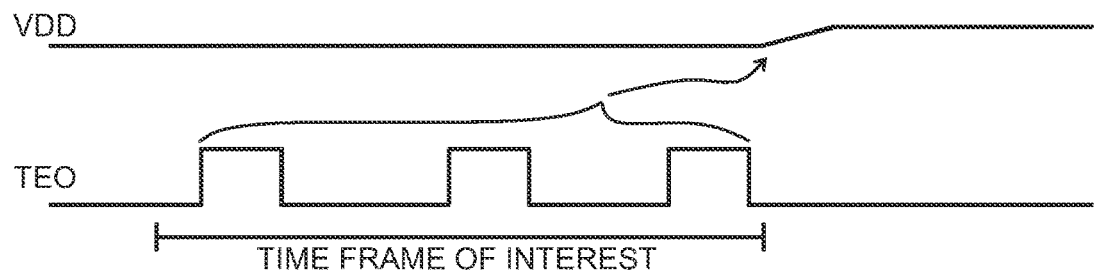
FIG. 19 illustrates re-regulating an operating voltage in response to detected timing event observation signals.

It is also possible that not every TEO signal needs to trigger a fast increase in the operating voltage. How the system reacts to TEO signals can be defined in the programmable deduction process executed by the bump control logic (see block 1002 in FIG. 10). FIG. 19 illustrates one example. In the case of FIG. 19 the system is configured to monitor for occurrence of TEO signals during a time frame of interest. The time frame of interest may be a sliding window, so that at each moment the system considers the number of TEO signals that occurred during the past N milliseconds preceding that moment, where N is some predefined number. The system may then be configured to perform the fast increase in operating voltage (i.e. the "bumping") and/or the re-regulating of operating voltage into conformity with a new, changed target value in response to a number of TEO signals that were observed during the time frame of interest. In the example shown in FIG. 19 the occurrence of three timing events (manifested by the three TEO signals) is interpreted as not requiring a fast increase but justifying slowly re-regulating the operating voltage VDD into conformity with a new target value.

In all embodiments the type(s) of register circuits used in the microelectronic circuit may comprise any known types of register circuits, including but not being limited to single-edge triggered flip-flops, double-edge triggered flip-flops, and latches. Examples of register circuits, as well as examples of monitor circuits combined with such register circuits, are known for example from the patent application number PCT/FI2017/050853 of the same applicant.

Figure 20:
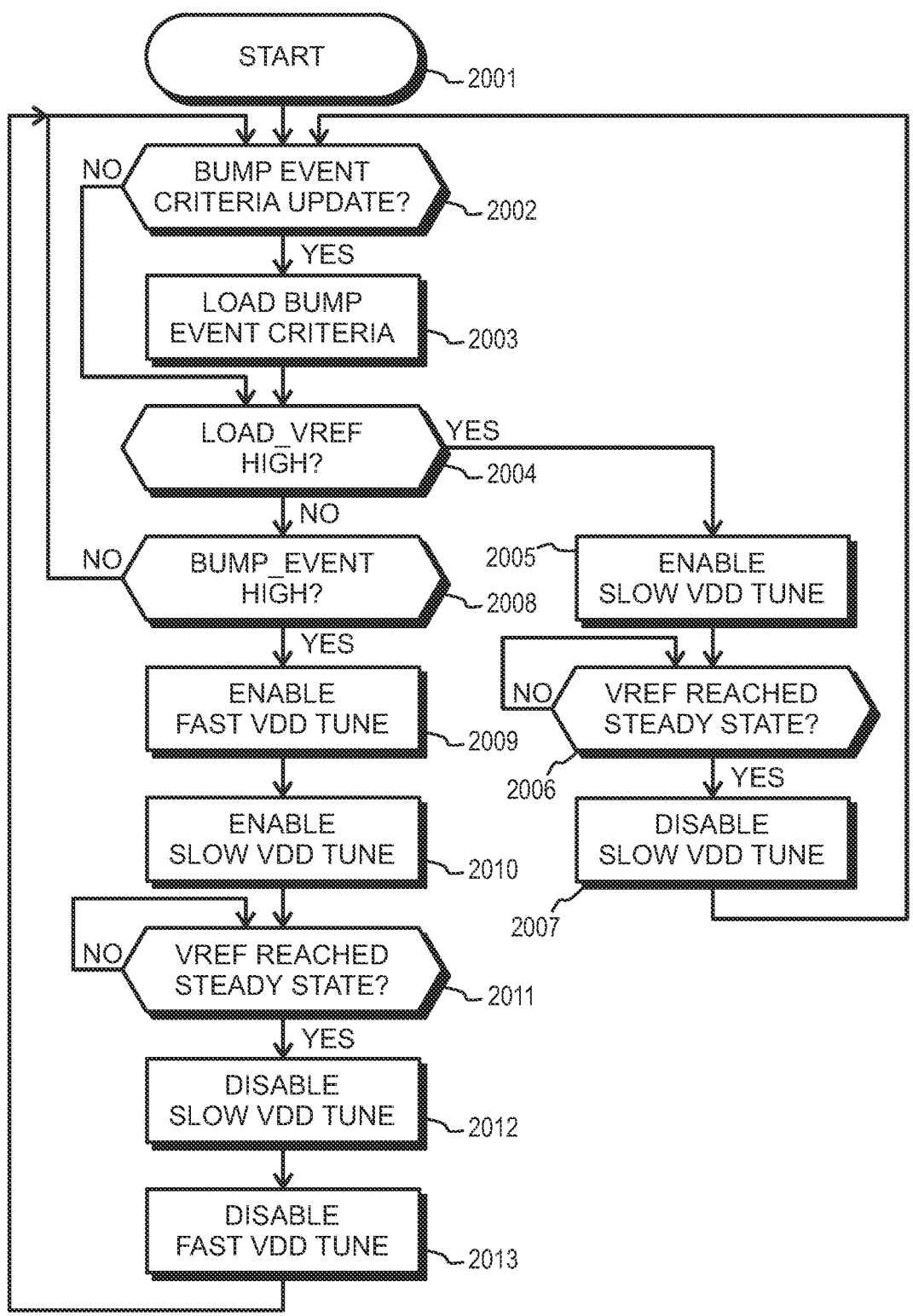
FIG. 20 illustrates a method of operating a microelectronic circuit and a controllable voltage source.

FIG. 20 illustrates a method for providing an operating voltage to an adaptive microelectronic circuit, the performance of which is at least partly configurable by selecting a value of said operating voltage. In general, the method comprises regulating said operating voltage into conformity with a target value using a controllable voltage source. It is characteristic to said controllable voltage source that reregulating said operating voltage into conformity with a new, changed target value involves a time constant.

A characteristic feature of the method of FIG. 20 is that it comprises using a TEO signal to trigger an increase in said operating voltage faster than said time constant. This may be done in particular to cancel the effect of time borrowing in a first register circuit, by shortening a characteristic propagation delay of a second logic unit that is located on a second processing path extending from a data output of said first register circuit through said second logic unit to a second register circuit. Said characteristic propagation delay depends on said operating voltage.

After the start 2001 the method comprises a check at step 2002 whether the bump event criteria are to be updated. Considering the exemplary embodiment shown in FIGS. 9 and 10 the microelectronic circuit 901 may set the Bump_PROG signal to indicate to the bump control logic functionality 1002 that new bump event criteria are to be loaded through the DIGITAL CODE connection; the possibility of such loading is shown as step 2003 in FIG. 20.

A negative finding in step 2002 leads to step 2004 where a check is made whether slow re-regulating into conformity with a new target value should take place, without fast bumping. A positive finding in step 2004 leads to enabling the slow VDD tuning functionality at step 2005, after which the re-regulating takes place in the loop consisting of step 2006 until the reference voltage VREF (which determines the new target value of VDD) has stabilized. A positive finding at step 2006 shows that re-regulating has been completed, so the slow VDD tuning functionality may be disabled again at step 2007 after which the execution of the method returns to step 2002.

A negative finding at step 2004 means that the system monitors for TEO signals and possible BE signals resulting from them, by executing step 2008 and always returning to step 2002 if there was no active BE signal. A positive finding at step 2008 triggers "bumping" by enabling the fast VDD tuning functionality at step 2009. Here it is assumed that a fast increase in the operating voltage VDD is always accompanied by an associated slow re-regulating, so the "bumping" made in step 2009 is followed by what is essentially a copy of steps 2005-2009 in steps 2010-2012. When the re-regulating is completed after step 2012 the effect of "bumping" may be canceled by disabling the fast VDD tuning functionality at step 2013 (compare to decrease 1202 in FIG. 12), after which the execution of the method returns to step 2002.

The principles discussed in association with the various embodiments above can be generalized to making multiple "bumps" within the length of one clock cycle of the digital logic, and/or to making "bumps" of different height per a single triggering event. An example of the first-mentioned is having the height of V_BUMP constant but choosing the number of "bumps" to be made in response to a bump-triggering event according to the current level of VDD. At near-threshold or sub-threshold VDD levels, like VDD≈0.5V or less, cancelling the effects of time borrowing may succeed with only a 1xV_BUMP increase in VDD, whereas at higher VDD levels like 0.6V≤VDD≤0.9V cancelling the effects of time borrowing may require a 3xV_BUMP increase in VDD. This is because processing delay depends almost exponentially on VDD at the lowest VDD levels, while the dependency is essentially (or at least closer to) linear at higher VDD levels. Another example is making a different number of "bumps" (or a bump of different height) depending on the currently used clock frequency. In general such embodiments may be characterized by saying that the system is configured to make the amplitude of the triggered fast increase in operating voltage dependent on an operating region of the microelectronic circuit, where operating region is defined in terms of operating parameter values such as operating voltage, clock frequency, and the like.

It is obvious to a person skilled in the art that with the advancement of technology, the basic idea of the invention may be implemented in various ways. The invention and its embodiments are thus not limited to the examples described above, instead they may vary within the scope of the claims.

The invention claimed is:

1. System comprising a microelectronic circuit and a controllable voltage source with an output coupled to said microelectronic circuit for providing an operating voltage to said microelectronic circuit, wherein:
   said microelectronic circuit is an adaptive microelectronic circuit, performance of which is at least partly configurable by selecting a value of said operating voltage at said output,
   said system is configured to regulate said operating voltage at said output into conformity with a target value, so that re-regulating said operating voltage into conformity with a new, changed target value involves a time constant,
   said microelectronic circuit comprises a first processing path, on which a first register circuit comprises a data input coupled to an output of a first logic unit that precedes said first register circuit on said first processing path,
   said microelectronic circuit is configured to respond to a digital value at said data input changing later than an allowable time limit by generating a timing event observation signal, hereinafter TEO signal, wherein said allowable time limit is defined by at least one triggering edge of at least one triggering signal coupled to said first register circuit,
   said system is configured to use said TEO signal to trigger an increase in said operating voltage at said output faster than said time constant.

2. A system according to claim 1, wherein:
   said microelectronic circuit comprises a second processing path extending from a data output of said first register circuit through a second logic unit to a second register circuit,
   said second logic unit has a characteristic propagation delay that depends on said operating voltage at said output,
   said first register circuit is a time-borrowing register circuit configured to effect time borrowing by validly storing a digital value at said data input that changed after said allowable time limit, said increase in said operating voltage at said output is dimensioned to cancel the effect of said time borrowing by shortening said characteristic propagation delay of said second logic unit.

3. A system according to claim 2, wherein:
said first register circuit is configured to apply a timing event detection window defining a length of time after said allowable time limit during which a changed digital value at said data input still becomes validly stored in said first register circuit,
the system is configured to shorten said characteristic propagation delay by at most the length of said timing event detection window through said increase in said operating voltage at said output.

4. A system according to claim 2, wherein:
said first register circuit is configured to apply a timing event detection window defining a length of time after said allowable time limit during which a changed digital value at said data input still becomes validly stored in said first register circuit,
the system is configured to shorten said characteristic propagation delay by more than the length of said timing event detection window through said increase in said operating voltage at said output.

5. A system according to claim 1, wherein the system is configured to use said TEO signal to trigger said increase in said operating voltage at said output by a constant amount of voltage per individual occurrence of said TEO signal.

6. A system according to claim 1, wherein the system is configured to make an amplitude of the triggered fast increase in operating voltage at said output dependent on an operating region of the microelectronic circuit, wherein said operating region is defined in terms of operating parameter values.

7. A system according to claim 1, wherein said first register circuit comprises a monitor circuit configured to:
monitor the timing of changes of digital values at said data input with respect to said allowable time limit, and
generate said TEO signal in response to a digital value at said data input changing later than said allowable timing limit.

8. A system according to claim 1, wherein:
said first register circuit is or belongs to a replica part used to replicate operation of an actual processing path with increased criticality to delay, and
said microelectronic circuit is configured to generate said TEO signal as a response to finding an incorrect stored value in said first register circuit.

9. A system according to claim 1, wherein said system is configured to additionally respond to said TEO signal by initiating re-regulating of said operating voltage at said output into conformity with a new, changed target value.

10. A system according to claim 1, wherein said system is configured to respond to a command to change said target value by initiating re-regulating of said operating voltage at said output into conformity with a new, changed target value.

11. A system according to claim 10, configured to generate said command to change said target value internally.

12. A system according to claim 1, wherein:
said controllable voltage source comprises a switched-capacitor voltage regulator that comprises a first switch or group of switches clocked with a first switching signal and a second switch or group of switches clocked with a second switching signal,
switching values in said first switching signal are non-overlapping with respect to switching values in said second switching signal, and
said system is configured to make an expedited change of value in said first and second switching signals as a part of said increase in said operating voltage at said output.

13. A system according to claim 1, wherein:
said controllable voltage source comprises a clocked comparator configured to compare a measured value of said operating voltage at said output to a reference value at a rate defined by a comparison clock, for triggering a charge pumping operation in said controllable voltage source when said measured value is lower than said reference value, and
said system is configured to increase the frequency of said comparison clock as a part of said increase in said operating voltage at said output.

14. A system according to claim 1, wherein:
said controllable voltage source comprises an input for receiving an input voltage and an output for outputting said operating voltage at said output, and a controllable impedance between said input and said output, and
said system is configured to decrease the value of said controllable impedance as a part of said increase in said operating voltage at said output.

15. A system according to claim 1, wherein:
said controllable voltage source comprises a clocked comparator configured to compare a measured value of said operating voltage at said output to a reference value, and
said system is configured to make a temporary offset in said reference value as a part of said increase in said operating voltage at said output.

16. A system according to claim 1, wherein:
the microelectronic circuit comprises a plurality of register circuits that each comprise a respective timing event observation output, for detecting timing events in multiple processing paths,
the system is configured to react to TEO signals differently depending on the processing path from which the TEO signals come.

17. A system according to claim 1, wherein:
the system is configured to monitor for occurrence of TEO signals during a time frame, and
the system is configured to perform at least one of said increase in said operating voltage at said output or re-regulating of said operating voltage at said output into conformity with a new, changed target value in response to a number of TEO signals observed during said time frame.

18. System comprising a microelectronic circuit and a controllable voltage source with an output for providing an operating voltage to said microelectronic circuit, wherein:
said microelectronic circuit is an adaptive microelectronic circuit, performance of which is at least partly configurable by selecting a value of said operating voltage at said output,
said system is configured to regulate said operating voltage at said output into conformity with a target value,
said microelectronic circuit comprises a first processing path, on which a first register circuit comprises a data input coupled to an output of a first logic unit that precedes said first register circuit on said first processing path,
said microelectronic circuit is configured to respond to a digital value at said data input changing later than an allowable time limit by generating a timing event observation signal, hereinafter TEO signal, wherein said allowable time limit is defined by at least one triggering edge of at least one triggering signal coupled to said first register circuit, said microelectronic circuit comprises a second processing path extending from a data output of said first register circuit through a second logic unit to a second register circuit, said second logic unit has a characteristic propagation delay that depends on said operating voltage at said output, said first register circuit is a time-borrowing register circuit configured to effect time borrowing by validly storing a digital value at said data input that changed after said allowable time limit, said system is configured to use said TEO signal to trigger an increase in said operating voltage at said output, said increase being dimensioned to cancel the effect of said time borrowing by shortening said characteristic propagation delay of said second logic unit.

19. Method for providing an operating voltage from a controllable voltage source with an output to an adaptive microelectronic circuit, performance of which is at least partly configurable by selecting a value of said operating voltage at said output, comprising:

regulating said operating voltage at said output into conformity with a target value using a controllable voltage source in which re-regulating said operating voltage at said output into conformity with a new, changed target value involves a time constant, monitoring the timing of changes of digital values at a data input of a first register circuit coupled to an output of a first logic unit that precedes said first register circuit on a first processing path of said microelectronic circuit, responding to a digital value at said data input changing later than an allowable time limit by generating a timing event observation signal, hereinafter TEO signal, wherein said allowable time limit is defined by at least one triggering edge of at least one triggering signal coupled to said first register circuit, and using said TEO signal to trigger an increase in said operating voltage at said output faster than said time constant.

20. A method according to claim 19, wherein said increase in said operating voltage at said output is dimensioned to cancel the effect of time borrowing in said first register circuit by shortening a characteristic propagation delay of a second logic unit, located on a second processing path extending from a data output of said first register circuit through said second logic unit to a second register circuit and having said characteristic propagation delay that depends on said operating voltage at said output.

21. A method according to claim 20, wherein a timing event detection window is applied to define a length of time after said allowable time limit during which a changed digital value at said data input still becomes validly stored in said first register circuit; and wherein said characteristic propagation delay is shortened by at most the length of said timing event detection window through said increase in said operating voltage at said output.

22. A method according to claim 20, wherein a timing event detection window is applied to define a length of time after said allowable time limit during which a changed digital value at said data input still becomes validly stored in said first register circuit; and wherein said characteristic propagation delay is shortened by more than the length of said timing event detection window through said increase in said operating voltage at said output.

23. A method according to claim 18, wherein said triggered fast increase in said operating voltage at said output is made by a constant amount of voltage per individual occurrence of said TEO signal.

24. A method according to claim 18, wherein an amplitude of the triggered fast increase in operating voltage at said output depends on an operating region of the microelectronic circuit, wherein said operating region is defined in terms of operating parameter values.

25. A method according to claim 18, comprising additionally responding to said TEO signal by initiating re-regulating of said operating voltage at said output into conformity with a new, changed target value.

* * * * *